US009051170B2

(12) United States Patent
Huang et al.

(10) Patent No.: US 9,051,170 B2
(45) Date of Patent: Jun. 9, 2015

(54) MICROELECTROMECHANICAL SYSTEM DEVICE WITH ELECTRICAL INTERCONNECTIONS AND METHOD FOR FABRICATING THE SAME

(75) Inventors: Chao-Ta Huang, Hsinchu (TW); Yu-Wen Hsu, Tainan (TW); Chin-Fu Kuo, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 450 days.

(21) Appl. No.: 13/459,271

(22) Filed: Apr. 30, 2012

(65) Prior Publication Data

US 2013/0167632 A1    Jul. 4, 2013

(30) Foreign Application Priority Data

Dec. 29, 2011    (TW) .............................. 100149587 A

(51) Int. Cl.
| | | |
|---|---|---|
| *G01P 15/08* | (2006.01) | |
| *H01L 21/76* | (2006.01) | |
| *B81B 7/00* | (2006.01) | |
| *G01R 33/028* | (2006.01) | |

(52) U.S. Cl.
CPC .......... *B81B 7/0006* (2013.01); *G01R 33/0286* (2013.01); *B81B 2201/0271* (2013.01); *B81B 2201/042* (2013.01); *B81B 2203/058* (2013.01); *B81B 2203/0109* (2013.01); *B81B 2203/0154* (2013.01)

(58) Field of Classification Search
USPC ............... 73/514.31, 514.34, 514.33, 514.32, 73/504.12, 504.04, 514.16; 257/417, 419, 257/421, 423, 427; 438/406, 411
See application file for complete search history.

(56) References Cited

U.S. PATENT DOCUMENTS

| | | | |
|---|---|---|---|
| 5,679,973 A * | 10/1997 | Mochizuki et al. | ........... 257/421 |
| 5,731,703 A | 3/1998 | Bernstein et al. | |
| 5,987,989 A * | 11/1999 | Yamamoto et al. | ........ 73/514.24 |
| 6,048,774 A * | 4/2000 | Yamamoto et al. | ........... 438/406 |
| 6,239,473 B1 * | 5/2001 | Adams et al. | ................. 257/419 |
| 6,240,782 B1 * | 6/2001 | Kato et al. | ................. 73/514.32 |
| 6,919,980 B2 | 7/2005 | Miyajima et al. | |
| 7,443,158 B2 * | 10/2008 | Oohashi et al. | .......... 324/207.22 |

(Continued)

FOREIGN PATENT DOCUMENTS

| | | |
|---|---|---|
| CN | 1755327 | 4/2006 |
| CN | 101187674 | 5/2008 |
| CN | 101844739 | 9/2010 |
| TW | 200305732 | 11/2003 |
| TW | 200644417 | 12/2006 |
| TW | 201128224 | 8/2011 |

OTHER PUBLICATIONS

Sunier et al., "Resonant Magnetic Field Sensor with Frequency Output", Journal of Microelectromechanical System, vol. 15, No. 5, Oct. 2006, p. 1098-1107.

(Continued)

*Primary Examiner* — Helen Kwok
(74) *Attorney, Agent, or Firm* — Jianq Chyun IP Office

(57) ABSTRACT

A microelectromechanical system device including anchors and mass is provided. Electrical interconnections are formed on the mass by using a insulation layer of mass, an electrical insulation trench and conductive through hole. The electrical interconnections replace the cross-line structure without adding additional processing steps, thereby reducing the use of the conductive layer and the electrical insulation layer. A method for fabricating the microelectromechanical system device is also provided.

28 Claims, 25 Drawing Sheets

(56) References Cited

U.S. PATENT DOCUMENTS

| | | | |
|---|---|---|---|
| 7,508,189 | B2 | 3/2009 | Berkcan et al. |
| 7,642,692 | B1 | 1/2010 | Pulskamp |
| 7,698,941 | B2 * | 4/2010 | Sasaki et al. ............... 73/514.29 |
| 8,695,426 | B2 * | 4/2014 | Hsu et al. ................... 73/504.12 |
| 2004/0017209 | A1 | 1/2004 | Goto |
| 2010/0307246 | A1 | 12/2010 | Fujii et al. |

OTHER PUBLICATIONS

Kadar et al., "Magnetic-field Measurements Using an Integrated Resonant Magnetic Field Sensor", Sensors and Actuators A, vol. 70, 1998, p. 225-232.

Ren et al., "Design and Analyses of a MEMS Based Resonant Magnetometer", Sensors, vol. 9, Sep. 2, 2009, p. 6951-6966.

Eyre et al., "Resonant Mechanical Magnetic Sensor in Standard CMOS", IEEE Electron Device Letters, vol. 19, No. 12, Dec. 1998, p. 496-498.

Kyynarainen et al., "A 3D Micromechanical Compass", Sensors and Actuators A, vol. 142, 2008, p. 561-568.

Hsu et al., "Micro-Electromechanical System Device Having Electrical Insulating Structure and Manufacturing Methods", U.S. Appl. No. 13/220,068, filed on Aug. 29, 2011, pp. 1-58.

"Office Action of China Counterpart Application", issued on Jan. 27, 2015, p. 1-5, in which the listed references were cited.

"Notice of Allowance of Taiwan Counterpart Application", issued on Nov. 20, 2014, p. 1-4, in which the listed references were cited.

* cited by examiner

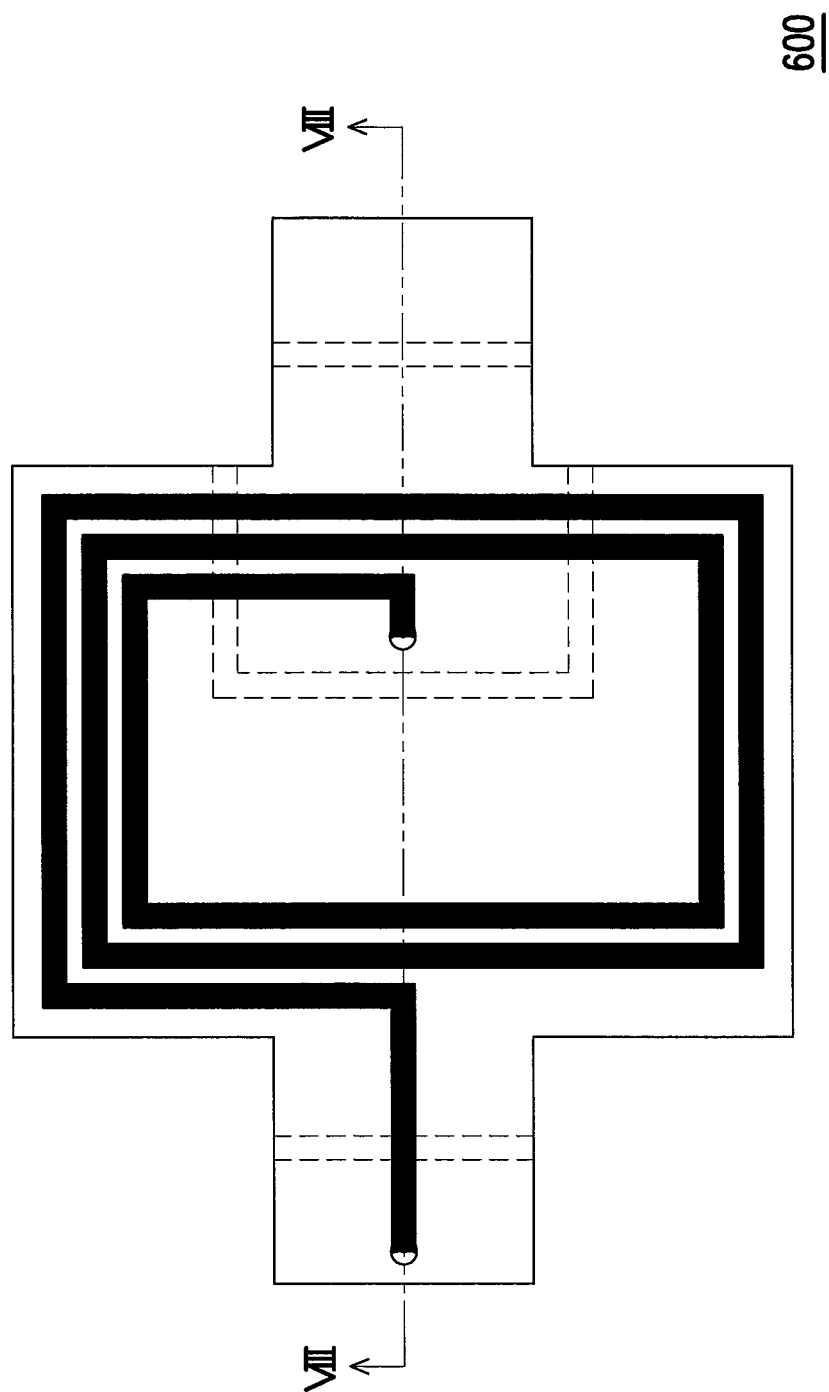

MICROELECTROMECHANICAL SYSTEM DEVICE WITH ELECTRICAL INTERCONNECTIONS AND METHOD FOR FABRICATING THE SAME

CROSS-REFERENCE TO RELATED APPLICATION

This application claims the priority benefit of Taiwan application serial no. 100149587, filed on Dec. 29, 2011. The entirety of the above-mentioned patent application is hereby incorporated by reference herein and made a part of this specification.

TECHNICAL FIELD

The disclosure relates to a microelectromechanical system (MEMS) device, in particular, to a microelectromechanical system device with electrical interconnections.

BACKGROUND

GPS technology has been widely applied in automobile navigation devices and personal navigation devices now. However, the error of GPS positioning signal may occur because the signals from satellite could be easily effected by shielding effects of terrain, buildings and weather conditions.

The industry solution has been provided by combining GPS technology with an inertia sensors (such as an accelerometer and a gyroscope). When the signal of the GPS device becomes weak or even failed due to the shielding effect (such as entering an underground parking lot), several approaches are provided for positioning, for example, an accelerometer and/or gyro. By continuously detecting acceleration by the accelerometer and/or detecting angular velocity by the gyro, the position of a car or person can be obtained, and the navigation function of the navigation device can work as normal in such a worse case. However, when the positions of the car or person are continuously obtained by the information from the accelerometer and/or the gyro, more and more calculation errors may be accumulated accordingly over time. That will cause the accuracy of the positions obtained by the navigation device being difficult to maintain.

A MEMS (Microelectromechanical systems) inertia sensing elements such as a magnetometer may be used to adjust the information from the gyro to avoid the accumulation of calculation errors over time. The location information measured by the magnetometer can be used to adjust the rotation angle calculated by the gyro, by which the accumulation of calculation errors can be reduced and the accuracy of the navigation device can be maintained and/or enhanced. In other word, the navigation device combining GPS device, accelerometer, gyro and magnetometer can prevent automobile navigation devices and personal navigation devices from the impact of the shielding effect.

With the innovation and applications of the MEMS (Microelectromechanical systems) inertia sensing elements on smart phones and navigation devices, the application scope of the navigation device can expand from an outdoor flat road to an indoor parking lot or to a large shopping mall. The MEMS magnetometer made with the MEMS technology has become a key element of the next-generation of automobile navigation devices and personal navigation devices.

A one-axis magnetometer is introduced herein in FIG. 1. In the uniaxial magnetometer 10, an electrical current I flows through a coil 14 on a twist plate 12. A magnetic field B will induce a Lorentz force F, and the Lorentz force F will drive the twist plate 12 to rotate. A sensing electrode (not shown) below the twist plate 12 can detect changes of the capacitance between the twist plate 12 and the sensing electrode. By the manner, the magnetic force of the position where the magnetometer 10 is located is obtained. If three uniaxial magnetometers 10 are disposed in three vertical axial directions, a three-axis magnetometer is formed. The location of the three-axis magnetometer can be deduced by calculating components of the geomagnetism on the three axial directions of the three-axis magnetometer, so as to realize a function similar to that of a compass.

At present a MEMS magnetometer usually adopts a single conductive coil design. Such MEMS magnetometers require large element size or require a large electrical current to sense the magnetic force, so it cannot satisfy the mobile phone product requirements of small size and low power consumption.

Another MEMS magnetometer adopts a design of a plurality of conductive coils. Referring to FIG. 2, the magnetometer 20 includes a plurality of coils 22 with a spiral path throughout a twist plate, but an extra cross-line structure 24 formed by a conductive layer 26 and an electrical insulation layer 28 are required to achieve electrical connections. In this way, the process requires more steps, and process cost and process risks are increased.

A MEMS micro-mirror is another application of the MEMS technology. Referring to FIG. 3, in the MEMS micro-mirror 30, the Lorentz force is produced after that the electrical current flowing through a coil 32 on a twist plate interacts with a permanent magnet 38. The Lorentz is used to drive the twist plate to rotate and to drive a mirror 34 on the twist plate to rotate accordingly. However, the coil 32 still requires the cross-line structure 36 to achieve electrical connection. Similarly, the process requires more steps, and process cost and process risks are increased.

SUMMARY

A microelectromechanical system device with electrical interconnections passing through an insulation layer of the mass and a method for fabricating the same are introduced herein.

In one of some exemplary embodiments, a microelectromechanical system device with electrical interconnections is provided herein. The microelectromechanical system device comprises a mass and a substrate. The mass comprises an insulation layer of the mass, a trench of the mass and a conductive through hole of the mass. The insulation layer of the mass divides the mass into a base conductive layer and a target conductive layer. The trench of the mass is disposed in the target conductive layer, passes through the target conductive layer to the insulation layer of the mass, and divides the target conductive layer into a first conductive portion and a second conductive portion which are insulated electrically from each other. The conductive through hole of the mass passes through the insulation layer of the mass and connects the base conductive layer and the first conductive portion. The substrate comprises at least one electrode disposed on an upper surface of the substrate, wherein in a working status, the electrical current flows through the base conductive layer, the conductive through hole of the mass and the first conductive portion, and an electrical potential difference exists between the second conductive portion and the electrode.

In one embodiment, the microelectromechanical system device with electrical interconnections is provided herein. The microelectromechanical system device comprises a first anchor. The first anchor includes a first insulation layer and a first trench. The first insulation layer divides the first anchor into an upper conductive layer of the first anchor and a lower conductive layer of the first anchor. The first trench is disposed in the lower conductive layer of the first anchor passing through the lower conductive layer of the first anchor to the first insulation layer. The first trench divides the lower conductive layer of the first anchor into an inner conductive portion of the first anchor and an outer conductive portion of the first anchor which are insulated electrically from each other. The inner conductive portion of the first anchor is electrically coupled to the second conductive portion.

In one embodiment, the microelectromechanical system device with electrical interconnections further comprises at least one first conductive through hole disposed in the first anchor. The at least one first conductive through hole passes through the first insulation layer and connects the upper conductive layer of the first anchor and the outer conductive portion of the first anchor.

In one embodiment, the microelectromechanical system device with electrical interconnections can further comprise at least one spring. The spring includes a third insulation layer. The third insulation layer divides the at least one spring into an upper conductive layer and a lower conductive layer. The lower conductive layer of the spring connects the inner conductive portion of the first anchor and the second conductive portion of the mass. The upper conductive layer of the spring connects the upper conductive layer of the first anchor and the base conductive layer.

In one embodiment, the microelectromechanical system device with electrical interconnections further comprises a device wherein a portion of the insulation layer of the mass is covered by the base conductive layer, and the base conductive layer is a spiral-shaped with at least one turn. The trench of the mass can be an open-loop-shaped electrical insulation trench. The device further comprises an electrical insulation material filled in the first trench and the trench of the mass to form another kind of electrical insulation trench.

In one embodiment, the microelectromechanical system device with electrical interconnections further comprises two permanent magnets and a second anchor. The first anchor and the second anchor are located on two opposite sides of the mass. The two permanent magnets are located near the mass and are aligned with a line that is perpendicular to the line connecting the first anchor and the second anchor.

In another one of some exemplary embodiments, a microelectromechanical device with electrical interconnections is provided herein. The microelectromechanical device comprises two anchors, a mass, and two torsion springs. The first anchor is one of the two anchors. The first anchor includes a first insulation layer and a first trench. The first insulation layer divides the first anchor into an upper conductive layer of the first anchor and a lower conductive layer of the first anchor. The first trench is disposed in the lower conductive layer of the first anchor and, passes through the lower conductive layer of the first anchor to the first insulation layer. The first trench divides the lower conductive layer of the first anchor into an inner conductive portion and an outer conductive portion which are insulated electrically from each other. A first conductive through hole is disposed in the first anchor, passing through the first insulation layer and connecting the upper conductive layer of the first anchor and the outer conductive portion.

In one embodiment, the second anchor includes a second insulation layer and a second trench. The second insulation layer divides the second anchor into an upper conductive layer of the second anchor and a lower conductive layer of the second anchor. The second trench of the second anchor is disposed in the lower conductive layer of the second anchor passing through the lower conductive layer of the second anchor to the second insulation layer. The second trench divides the lower conductive layer into an inner conductive portion and an outer conductive portion which are insulated electrically from each other.

In one embodiment, the mass includes an insulation layer of the mass, a trench of the mass and a conductive through hole of the mass. The insulation layer of the mass divides the mass into a base conductive layer and a target conductive layer. The trench of the mass passes through the target conductive layer to the insulation layer of the mass, and divides the target conductive layer into a first conductive portion and a second conductive portion which are insulated electrically from each other. The conductive through hole of the mass passes through the insulation layer of the mass and connecting the base conductive layer and the first conductive portion.

In one embodiment, each torsion spring includes a third insulation layer, which divides the torsion spring into an upper conductive layer of the torsion spring and a lower conductive layer of the torsion spring. The base conductive layer can be a spiral-shaped conductor having at least one turn. The upper conductive layer of one of the torsion springs connects the upper conductive layer of the first anchor and the base conductive layer. The lower conductive layer of the one of the torsion springs connects the inner conductive portion of the first anchor and the second conductive portion of the mass. The lower conductive layer of the other torsion spring connects the inner conductive portion of the second anchor and the first conductive portion of the mass.

In one of some exemplary embodiments, a method for fabricating a microelectromechanical system device with electrical interconnections is provided herein. The method includes the following steps. Provide a silicon on insulator wafer, where the silicon on insulator wafer includes a device layer, an insulation layer and a handle layer stacked sequentially. Etch the device layer to form a recess portion and a plurality of protruding portions. Bond the plurality of protruding portions with a substrate. Remove the handle layer. Form a plurality of upper conductive layers on the insulation layer. Pattern the device layer such that the plurality of protruding portions is formed to be a plurality of lower conductive layers of a plurality of anchors, and the recess portion is formed to be a lower conductive layer of a mass and a lower conductive layer of at least one torsion spring. Pattern the insulation layer to form insulation layers of the anchors, an insulation layer of the mass and an insulation layer of the torsion spring.

In another one of some exemplary embodiments, a method for fabricating a microelectromechanical system device with electrical interconnections is provided. The method includes the following steps. Provide a silicon on insulator wafer, where the silicon on insulator wafer includes a device layer, an insulation layer and a handle layer stacked sequentially. Etch the device layer to form a recess portion and a plurality of protruding portions, where the recess portion is to form a lower conductive layer of a mass and a lower conductive layer of at least one torsion spring, and the plurality of protruding portions are to form a plurality of lower conductive layers of a plurality of anchors. Etch a first trench at the at least one of the plurality of protruding portions and etch a trench of the mass at the recess portion, where the first trench and the trench of the mass extend to the insulation layer, the first trench divides the lower conductive layer of the anchor into an inner conductive portion and an outer conductive portion which are insulated electrically from each other, and the trench of the mass divides the lower conductive layer of the mass into a first conductive portion and a second conductive portion which are insulated electrically from each other. Bond the protruding portions with a substrate. Remove the handle layer. Form at least one first through hole through the insulation layer on the one of the plurality of protruding portions and at lest one second through hole through the insulation layer on the recess portion, wherein a portion of the one of the plurality of protruding portions is exposed in the first through hole and a part of the recess portion is exposed in the second through hole. Form a plurality of upper conductive layers on the insulation layer and filling the upper conductive layers in the first through hole and the second through hole to form a first conductive through hole and a conductive through hole of the mass. The first conductive through hole and the conductive through hole of the mass pass through the insulation layers, the first conductive through hole connects the upper conductive layer of the first anchor and the outer conductive portion of the first anchor, the conductive through hole of the mass connects the upper conductive layer of the mass and the first conductive portion. The first conductive portion electrically couples the inner conductive portion of the second anchor and the second conductive portion electrically couples the inner conductive portion of the first anchor. Pattern the device layer such that the plurality of protruding portions is formed to be the lower conductive layer of the anchors, and the recess portion is formed to be the lower conductive layer of the mass and the lower conductive layer of at least one torsion spring. Pattern the insulation layer to form insulation layers of the anchors, an insulation layer of the mass and an insulation layer of the torsion spring.

Based on the above, electrical interconnections are formed by employing the upper conductive layer, lower conductive layer, an electrical insulation layer, trench and conductive through hole. The electrical interconnections may substitute the cross-line structure without additional process steps, thereby reducing the use of the conductive layer and the insulation layer.

BRIEF DESCRIPTION OF THE DRAWINGS

FIG. 11A is a top view of a microelectromechanical system device with electrical interconnections according to another embodiment of the disclosure.

DETAILED DESCRIPTION

Figure 1:
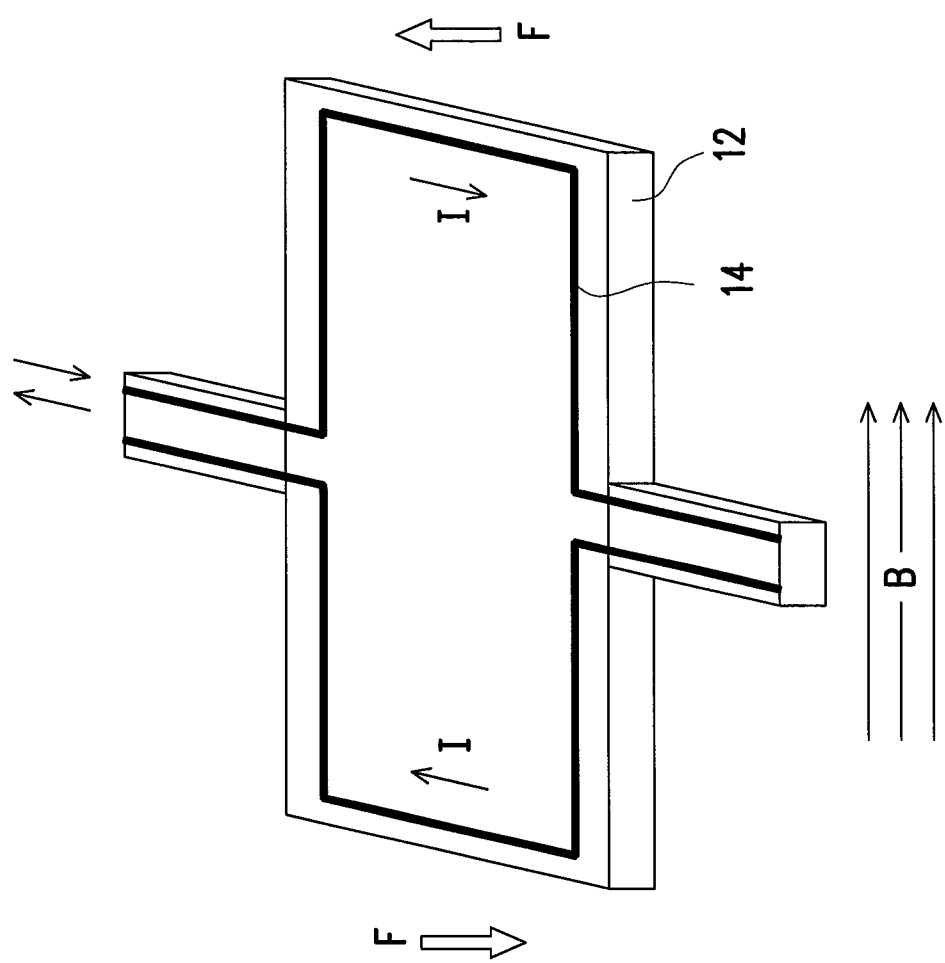
FIG. 1 and FIG. 2 are schematic diagrams illustrating two conventional magnetometers.
Figure 2:
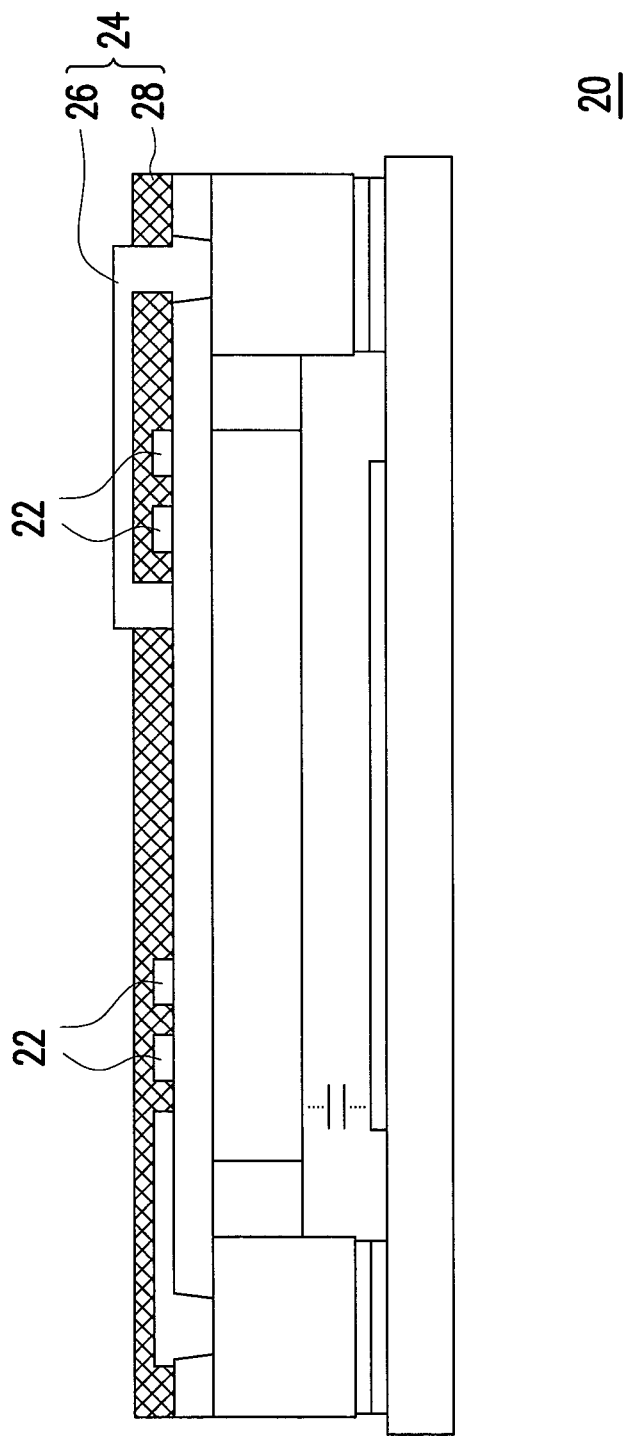
Figure 3:
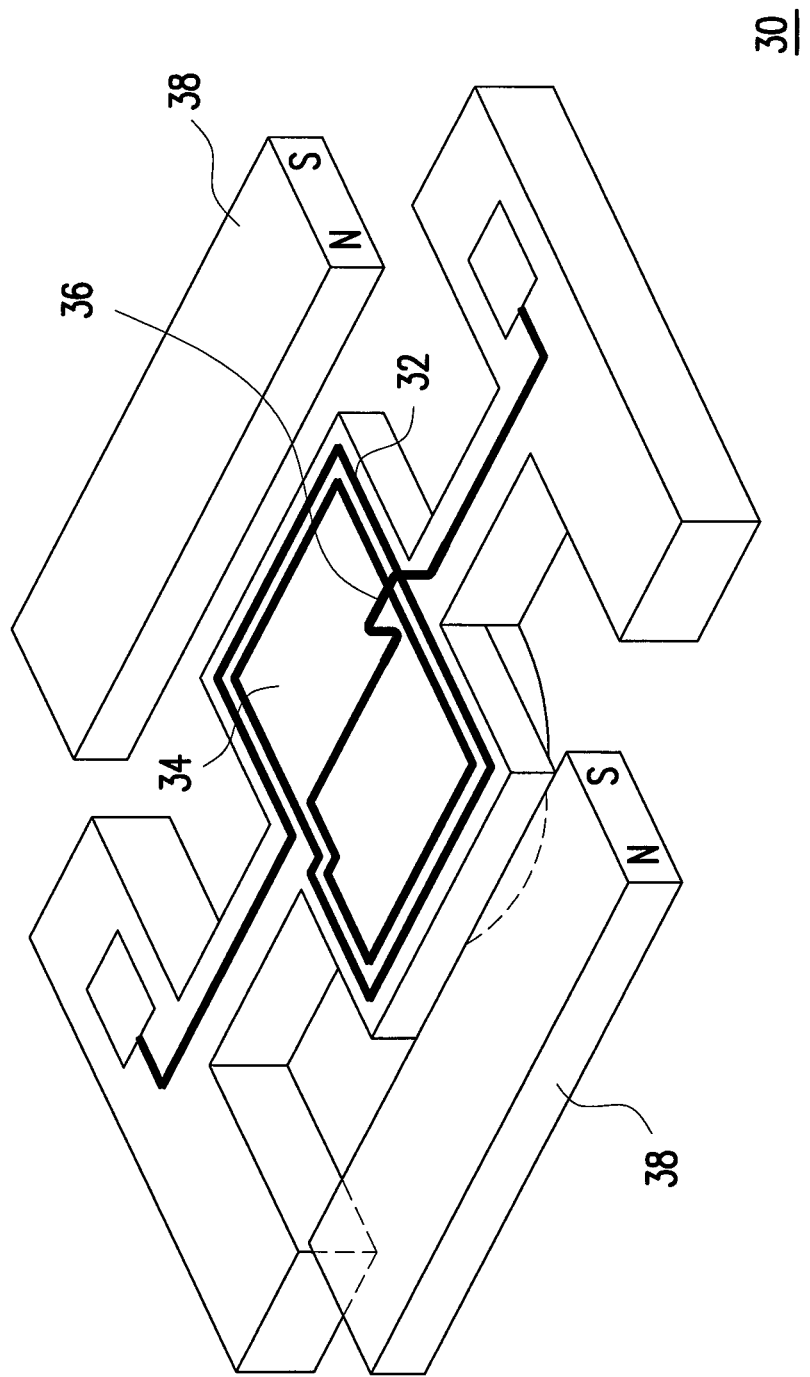
FIG. 3 is a schematic diagram illustrating a conventional MEMS micro-mirror.
Figure 4A:
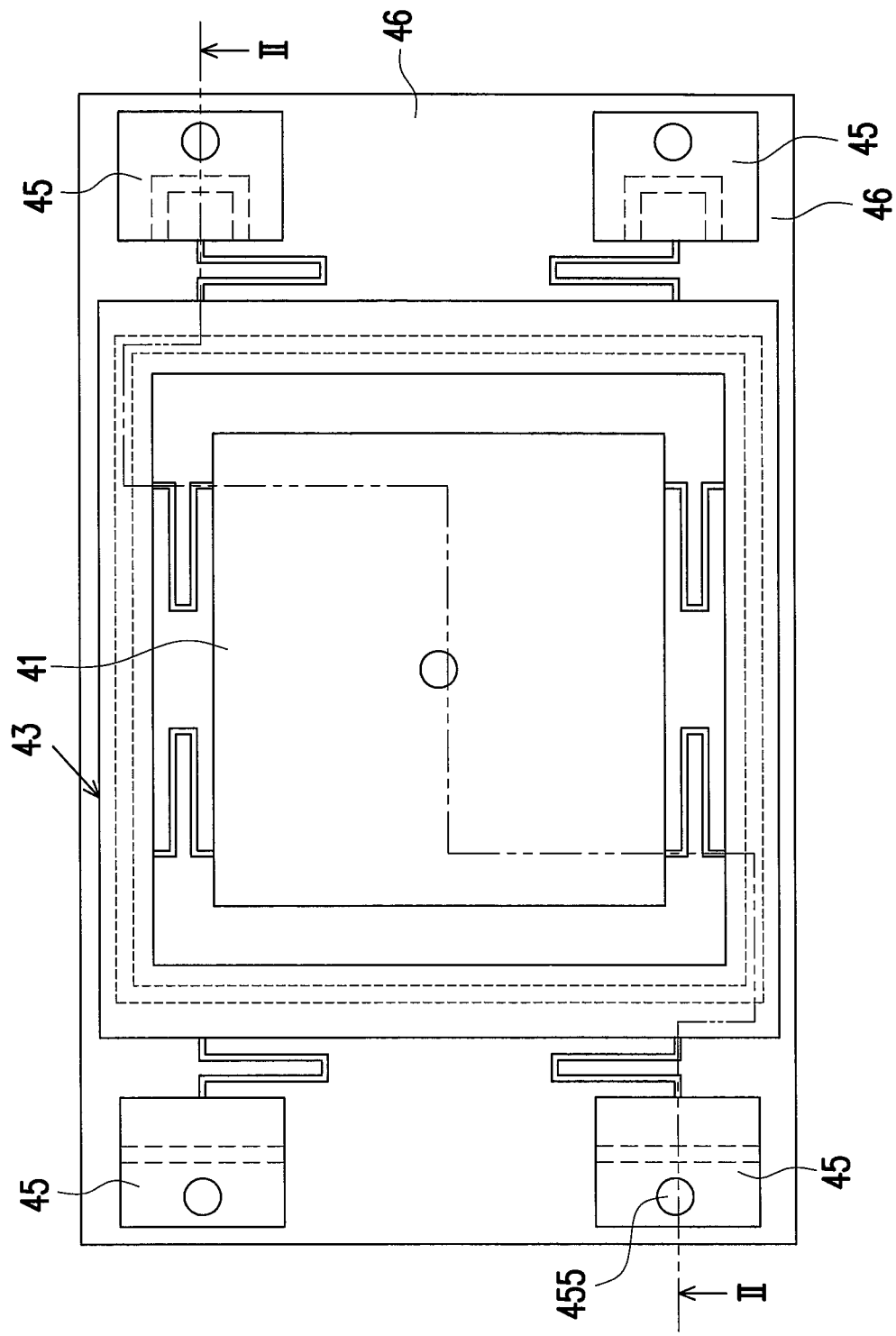
FIG. 4A is a top view of a microelectromechanical system device with an insulation structure of ROC Patent Application No. 099145427.
Figure 4B:
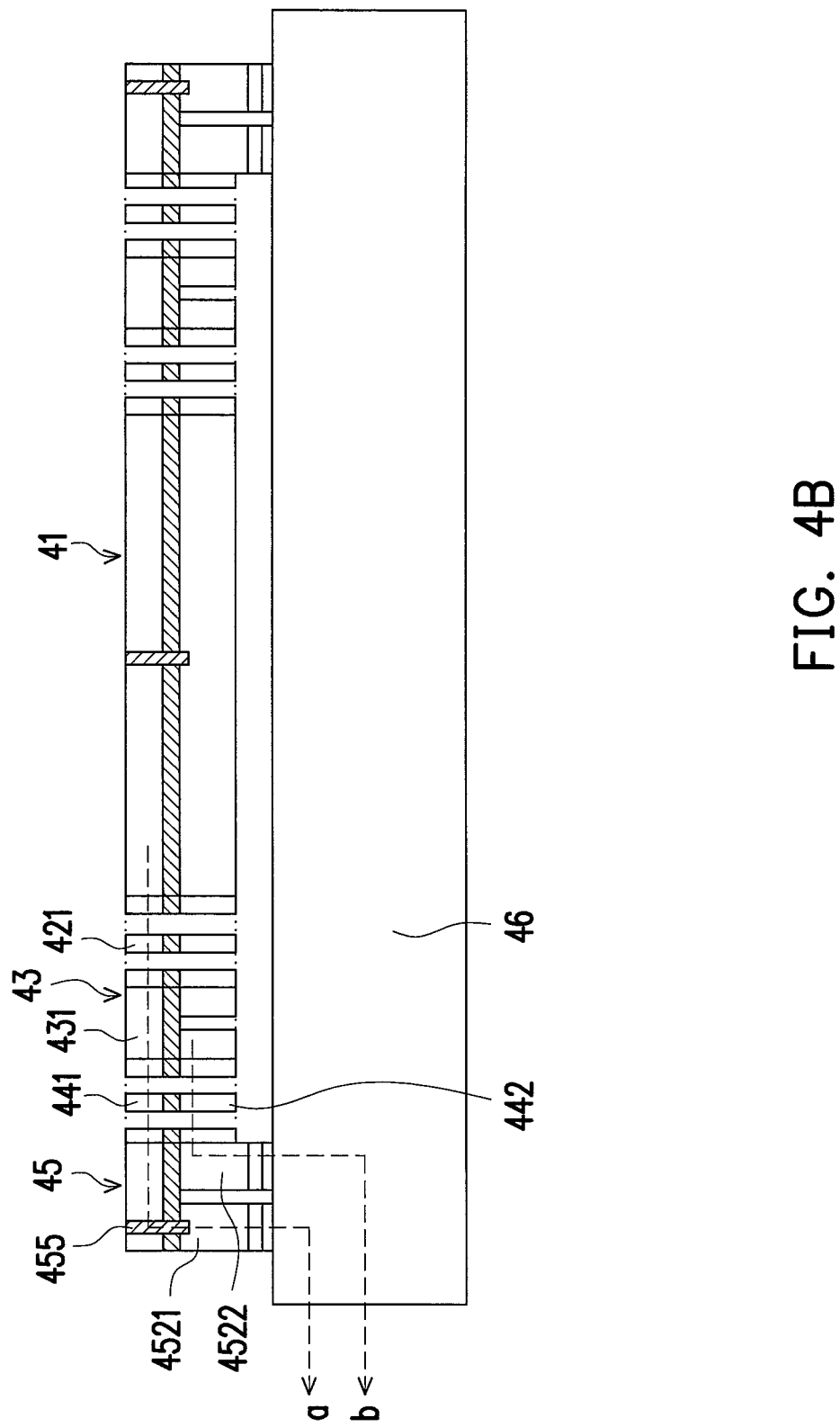
FIG. 4B is a cross-sectional view along a section line II-II in FIG. 4A.

A microelectromechanical system device with an electrical insulation structure as illustrated in U.S. Pat. No. 13/220,068 filed on Aug. 29, 2011 is depicted in FIGS. 4A and 4B. All disclosures thereof are incorporated by reference herewith. FIG. 4A depicts a top view of a microelectromechanical system device with an electrical insulation structure. FIG. 4B is a cross-sectional view along a section line II-II in FIG. 4A. As shown in FIG. 4A and FIG. 4B, an electrical signal from a mass 41 is transmitted to an anchor 45 via a path labelled as arrow "a" from an upper conductive portion 421 of a spring, an upper conductive portion 431 of a frame 43, an upper conductive portion 441 of a spring, a conductive through hole 455 connected to an outer conductive region 4521 of the anchor 45. The signal from the mass 41 is then transmitted to a conductive trace (not shown) on a substrate 46 via the outer conductive region 4521 of the anchor 45. An electrical signal from the frame 43 is transmitted to an inner conductive region 4522 of the anchor 45 via a lower conductive portion 442 of the spring and is then transmitted to another conductive trace (not shown) on the substrate 46, as a path labelled an arrow "b." However, in FIG. 4A and FIG. 4B, it is impossible for the mass 41 to be an electrical interconnection allowing the electrical current to flow through it and to be an electrode plate having an electrical potential difference at the same time.

Some of exemplary embodiments of the disclosure provide a microelectromechanical system device with electrical interconnections, which includes a mass, a conductive through hole of mass and a substrate. The mass includes a insulation layer of mass and a trench of mass. The insulation layer of mass divides the mass into a base conductive layer and a target conductive layer. The trench of mass is disposed in the target conductive layer and passes through the target conductive layer to the insulation layer of mass, and divides the target conductive layer into a first conductive portion and a second conductive portion which are insulated electrically from each other. The conductive through hole of mass passes through the insulation layer of mass, and connects the base conductive layer and the first conductive portion. The substrate includes at least one electrode which is disposed on the upper surface of the substrate. In the working status, an electrical current flows through the base conductive layer, the conductive through hole of mass and the first conductive portion, and an electrical potential difference exists between the second conductive portion and the electrode. In this way, the microelectromechanical system device of this embodiment provides two independent electrical interconnections without a cross-line structure.

The target conductive layer may be a lower conductive layer located below the electrical insulation layer of mass. And the target conductive layer may also be an upper conductive layer located on the electrical insulation layer of mass.

Figure 5A:
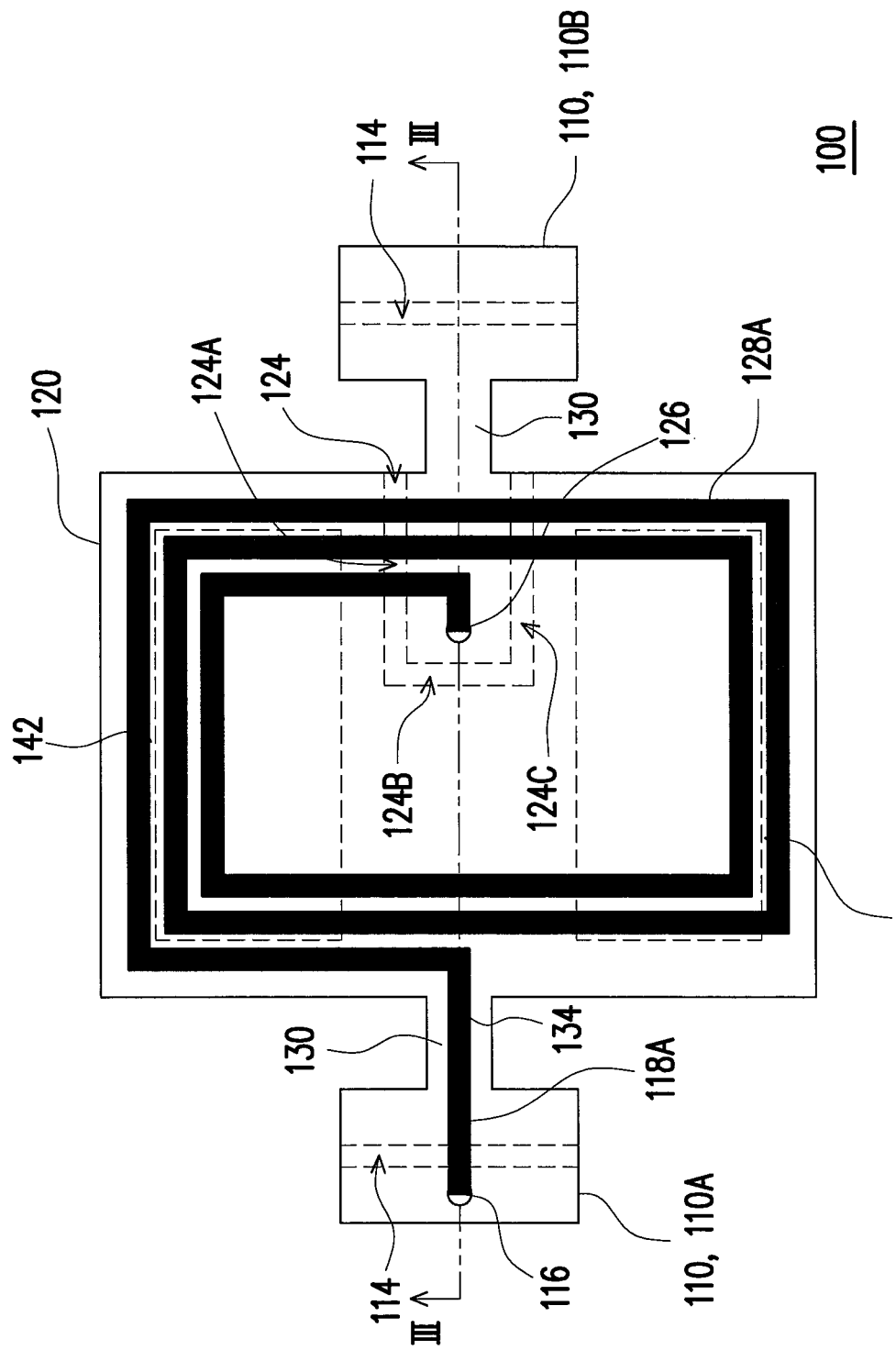
FIG. 5A is a top view of a microelectromechanical system device with electrical interconnections according to an embodiment of the disclosure.
Figure 5B:
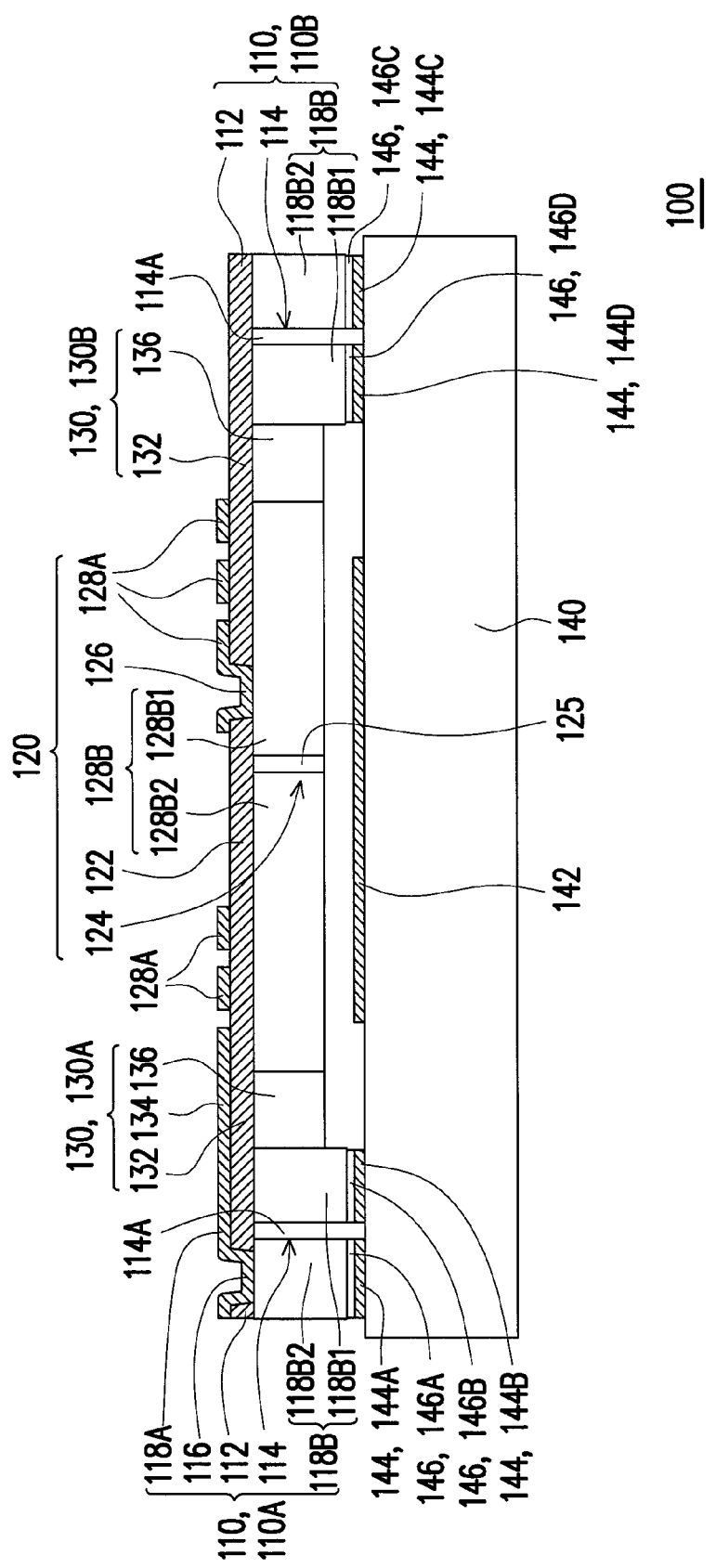
FIG. 5B is a side view of the microelectromechanical system device in FIG. 5A along a section line III-III.

One of some exemplary embodiments of the disclosure is illustrated in FIGS. 5A and 5B, but not limited thereto. FIG. 5A is a top view of a microelectromechanical system device with electrical interconnections according to an embodiment of the disclosure. FIG. 5B is a side view of the microelectromechanical system device in FIG. 5A along a section line III-III.

Referring to FIG. 5A and FIG. 5B, the microelectromechanical system device with electrical interconnections 100 is an MEMS magnetometer. The microelectromechanical system device 100 includes two anchors 110, a mass 120, two torsion springs 130 and a substrate 140. The two anchors 110 are secured on the substrate 140. The mass 120 is connected between the two anchors 110 via the two torsion springs 130. In other words, the mass 120 is rotatably suspended over the substrate 140 by the torsion springs 130 and the anchors 110.

Each anchor 110 (referring to the first anchor 110A and the second anchor 110B shown in the drawings) includes a first insulation layer 112 and a first trench 114, and the first anchor 110A further includes a first conductive through hole 116. In another embodiment, the second anchor 110B may further include a first conductive through hole 116. The first anchor 110A is used as an example for explanation herein. The first insulation layer 112 divides the anchor 110 into an upper conductive layer 118A and a lower conductive layer 118B which are electrically insulated from each other by the first insulation layer 112. The first trench 114 is disposed in the lower conductive layer 118B of the anchor 110 and passes through the lower conductive layer 118B of the anchor 110 to the first insulation layer 112 of the anchor 110. The first trench 114 divides the lower conductive layer 118B of the anchor into an inner conductive portion 118B1 and an outer conductive portion 118B2 which are electrically insulated from each other by the first trench 114. The first conductive through hole 116 is disposed in the first anchor 110A and passes through the first insulation layer 112 of the first anchor 110A. The first conductive through hole 116 also connects the upper conductive layer 118A of the first anchor 110A and the outer conductive portion 118B2. An electrical insulation material 114A may be filled in the first trench 114 to form an electrical insulation structure by which the inner conductive portion 118B1 and an outer conductive portion 118B2 are electrically insulated from each other.

The mass 120 includes a insulation layer 122 of mass 120, a trench 124 of mass 120 and a conductive through hole 126 of mass 120. The insulation layer 122 of mass 120 divides the mass 120 into a base conductive layer 128A and a target conductive layer 128B. The trench 124 of mass 120 is disposed in the target conductive layer 128B, and passes through the target conductive layer 128B to the insulation layer 122 of mass 120. The trench 124 of mass 120 also divides the target conductive layer 128B into a first conductive portion 128B1 and a second conductive portion 128B2 which are insulated electrically from each other by the trench 124 of mass 120. The base conductive layer 128A is the upper conductive layer located on one surface of the insulation layer 122 of mass 120 away from the substrate 140, while the target conductive layer 128B is the lower conductive layer located between the insulation layer 122 of mass 120 and the substrate 140, but the disclosure is not limited to this.

The trench 124 of mass 120 is located at the target conductive layer 128B. The trench 124 of mass 120 is shaped as a letter U. Referring to the top view in FIG. 5A, the mass 120 is rectangular, and the U-shaped trench 124 of mass 120 has an opening. The opening of the U-shaped trench 124 of mass 120 faces toward the torsion spring 130 that connects the anchor 110B and the mass 120, and two ends of the opening extend to the same side edge of the target conductive layer 128B such that the first conductive portion 128B1 and a second conductive portion 128B2 are insulated electrically from each other by the U-shaped trench 124 of mass 120 and the lower conductive layer 136 of the torsion spring 130 and second conductive portion 128B2 are also insulated electrically from each other by the U-shaped trench 124 of mass 120. In other words, the U-shaped trench 124 of mass 120 is one kind of electrical insulation trench.

The second segment 124B of the U-shaped trench 124 of mass 120 is substantially perpendicular to the section line III-III. In other words, two ends of the U-shaped trench 124 of mass 120 point to the second anchor 110B. An electrical insulation material 124A may be filled in the U-shaped trench 124 of mass 120 to form an electrical insulation structure. In this way, the U-shaped trench 124 of mass 120 which is filled with the insulation material 124A can be another kind of electrical insulation trench.

In another exemplary embodiment, the trench 124 of mass 120 may be shaped as any polygon with an opening or may be shaped as any loop with an opening (open-loop-shaped trench), and two ends of the opening extend to the same side edge of the target conductive layer 128B such that the first conductive portion 128B1 and a second conductive portion 128B2 are insulated electrically from each other by the trench 124 of mass 120. And the lower conductive layer 136 of the torsion spring 130 (the torsion spring, on right side of FIG. 5A, which connects the mass 120 and the second anchor 110B) and second conductive portion 128B2 are also insulated electrically from each other by the trench 124 of mass 120. In other words, the trench 124 of mass 120 is one kind of open-loop-shaped electrical insulation trench.

The conductive through hole 126 of mass 120 passes through the insulation layer 122 of the mass 120, and the conductive through hole 126 of mass 120 connects the base conductive layer 128A and the first conductive portion 128B1. A portion of the insulation layer 122 of the mass 120 is covered by the base conductive layer 128A. The base conductive layer 128A is a spiral-shaped conductor having at least a turn and a spiral path throughout the mass 120. Hence, the Lorentz force will be produced when the electrical current flowing through the base conductive layer 128A interacts with the magnetic force, thus the mass 120 rotates relative to the anchor 110.

Referring to FIG. 5A and FIG. 5B, the torsion spring 130 connects the anchor 110 and the mass 120. The torsion spring 130 is a beam, so that the mass 120 can rotate relative to the anchor 110. Each torsion spring 130 includes a third insulation layer 132. The third insulation layer 132 divides the torsion spring 130 (the torsion spring 130A) on the left side in FIG. 5A and FIG. 5B into an upper conductive layer 134 of the torsion spring 130A and a lower conductive layer 136 of the torsion spring 130A which are insulated electrically from each other by the third insulation layer 132. The upper conductive layer 134 of the torsion spring 130 (the torsion spring 130A) on the left side in FIG. 5A and FIG. 5B connects the base conductive layer 128A and the upper conductive layer 118A of the first anchor 110A.

The lower conductive layer 136 of the torsion spring 130 (the torsion spring 130B) on the right side in FIG. 5A and FIG. 5B connects the inner conductive portion 118B1 of the second anchor 110B and the first conductive portion 128B1 of the mass 120, so that the first conductive portion 128B1 of the mass 120 is electrically coupled to the inner conductive portion 118B1 of the second anchor 110B. The lower conductive layer 136 of the torsion spring 130 (the torsion spring 130A) on the left side in FIG. 5A and FIG. 5B connects the inner conductive portion 118B1 of the first anchor 110A and the second conductive portion 128B2 of the mass 120, so that the second conductive portion 128B2 of the mass 120 is electrically coupled to the inner conductive portion 118B 1 of the first anchor 110A.

The substrate 140 includes at least one electrode 142 and a plurality of conductive layers 144. In this embodiment, two electrodes 142 are disposed on the substrate 140 respectively and are located below the mass 120. The two electrodes 142 are mirror-symmetrical to each other with respect to the section line The substrate 140 includes a plurality of conductive layers 144 which are disposed on the substrate 140 and is located below the anchor 110. The microelectromechanical system device 100 further includes a plurality of conductive bonding layers 146. The outer conductive portion 118B2 and the inner conductive portion 1181 of the anchor 110 are electrically coupled to different conductive layers 144 on the substrate 140 respectively via the conductive bonding layer 146. More particularly, the outer conductive portion 118B2 of the anchor 110A is connected to the conductive layer 144A on the substrate 140 via the conductive bonding layer 146A. The inner conductive portion 118B1 of the anchor 110A is connected to the conductive layer 144B on the substrate 140 via the conductive bonding layer 146B. The outer conductive portion 118B2 of the anchor 110B is connected to the conductive layer 144C on the substrate 140 via the conductive bonding layer 146C. The inner conductive portion 118B1 of the anchor 110B is connected to the conductive layer 144D on the substrate 140 via the conductive bonding layer 146D. Each of the conductive layers 144A, 144B, 144C and 144D is separated from each other.

Referring to FIG. 5A and FIG. 5B, in a working status, a current path exists through the MEMS device 100. In the current path, an electrical current flows through the conductive layer 144A, the conductive bonding layer 146A, the outer conductive portion 118B2 of the first anchor 110A, the first conductive through hole 116, the upper conductive layer 118A of the first anchor 110A, the upper conductive layer 134 of the torsion spring 130A, the base conductive layer 128A, the conductive through hole 126 of the mass 120, the first conductive portion 128B1 and the lower conductive layer 136 of the torsion spring 130B, the inner conductive portion 118B1 of the second anchor 110B, the conductive bonding layer 146D and the conductive layer 144D sequentially. The Lorentz force produced by the electrical current flowing through the base conductive layer 128A and the magnetic force drives the mass 120 to rotate relative to the anchor 110. By a conductive bonding layer 146A, 146B, the outer conductive portion 118B1 of the first anchor 110A and the inner conductive portion 118B2 of the first anchor 110A are connected to different conductive layers 144A, 144B on the substrate 140 respectively to form two electrical interconnections which are insulated electrically from each other.

In the working status, the first electrical potential will exist in the second conductive portion 128B2 of the target conductive layer 128B. The second electrical potential will exist in the electrode 142 of the substrate 140. The electrical potential difference will exist between the second conductive portion 128B2 of the target conductive layer 128B and electrode 142 of the substrate 140. The two electrodes 142 and the second conductive portion 128B2 of the mass will respectively be equivalent to be two capacitors. When the Lorentz force, produced by the electrical current and the magnetic force, drives the mass 120 to rotate relative to the anchor 110, the capacitances of the two capacitors will be varied. The magnetic force at the place where the microelectromechanical system device 100 is located can be obtained by calculating the variation of the capacitance.

Figure 6:
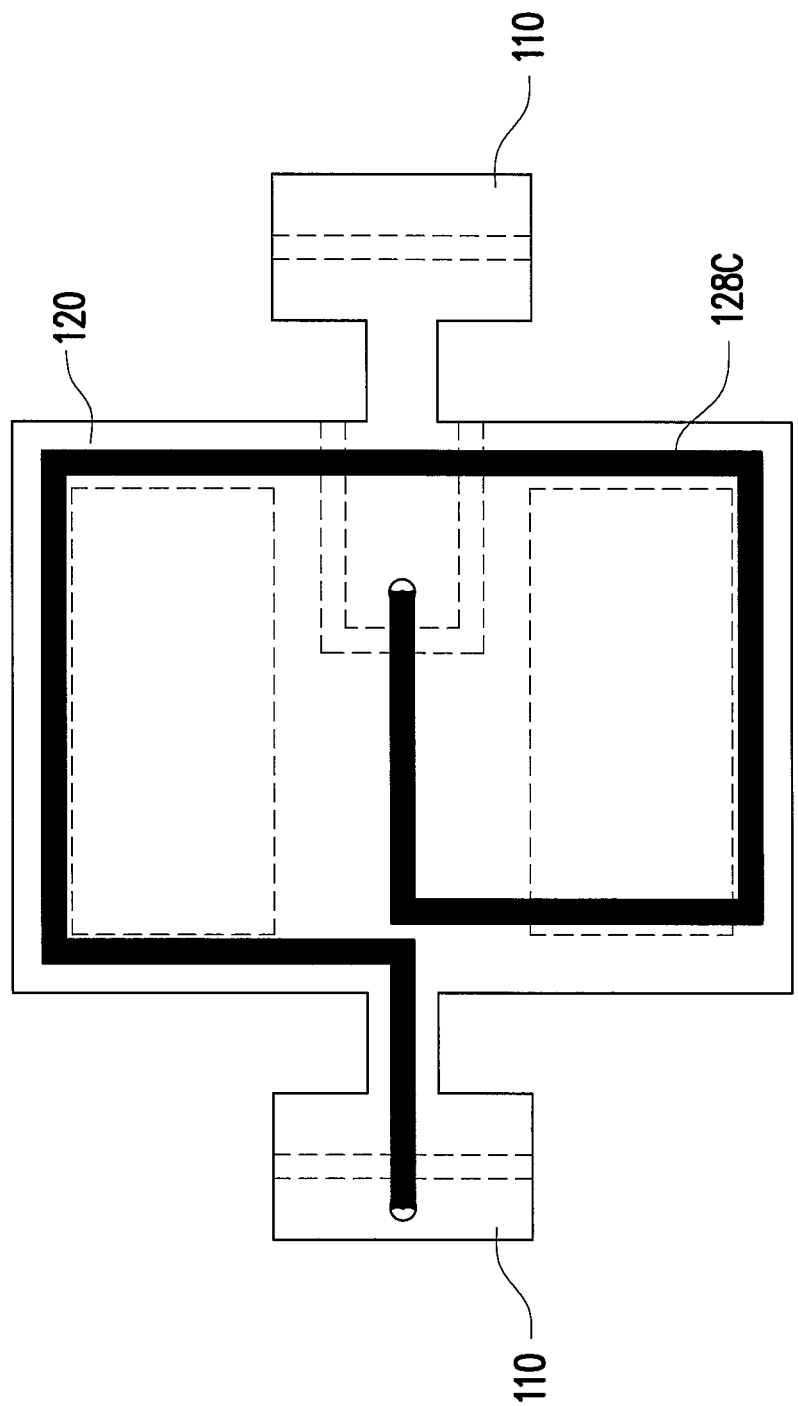
FIG. 6 is a top view of a microelectromechanical system device with electrical interconnections according to another embodiment of the disclosure.

In one of some exemplary embodiments for depicting a layout of the base conductive layer 128C on the mass 120 is schematically illustrated in FIG. 6, but not limited thereto. The base conductive layer 128C of the mass 120 is a single-turn spiral-shaped conductor surrounding the periphery of the mass 120. The Lorentz force also will be produced when the electrical current flowing through the base conductive layer 128C interacts with the magnetic force, thus the mass 120 rotates relative to the anchor 110.

Figure 7A:
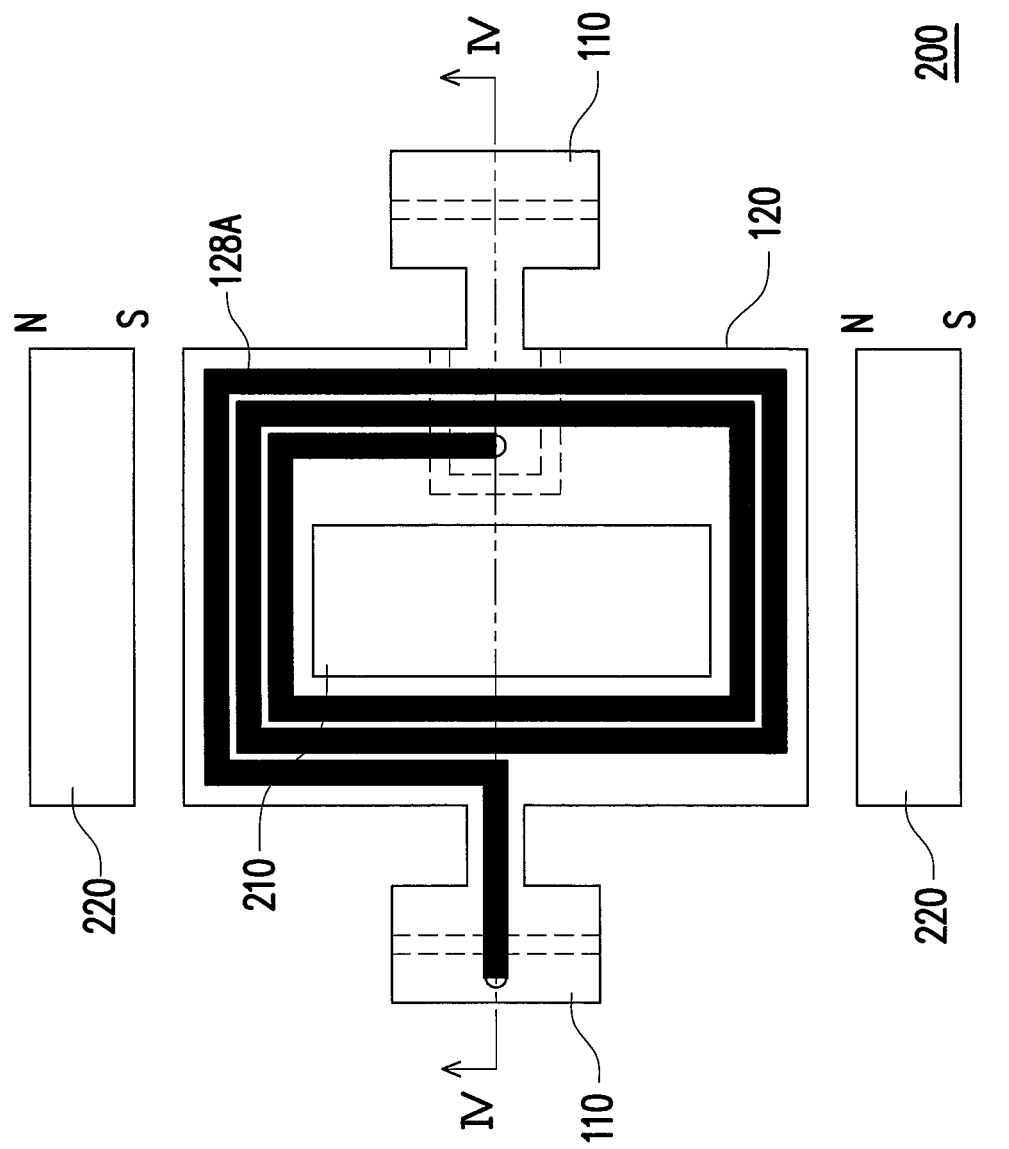
FIG. 7A is a top view of a microelectromechanical system device with electrical interconnections according to another embodiment of the disclosure.
Figure 7B:
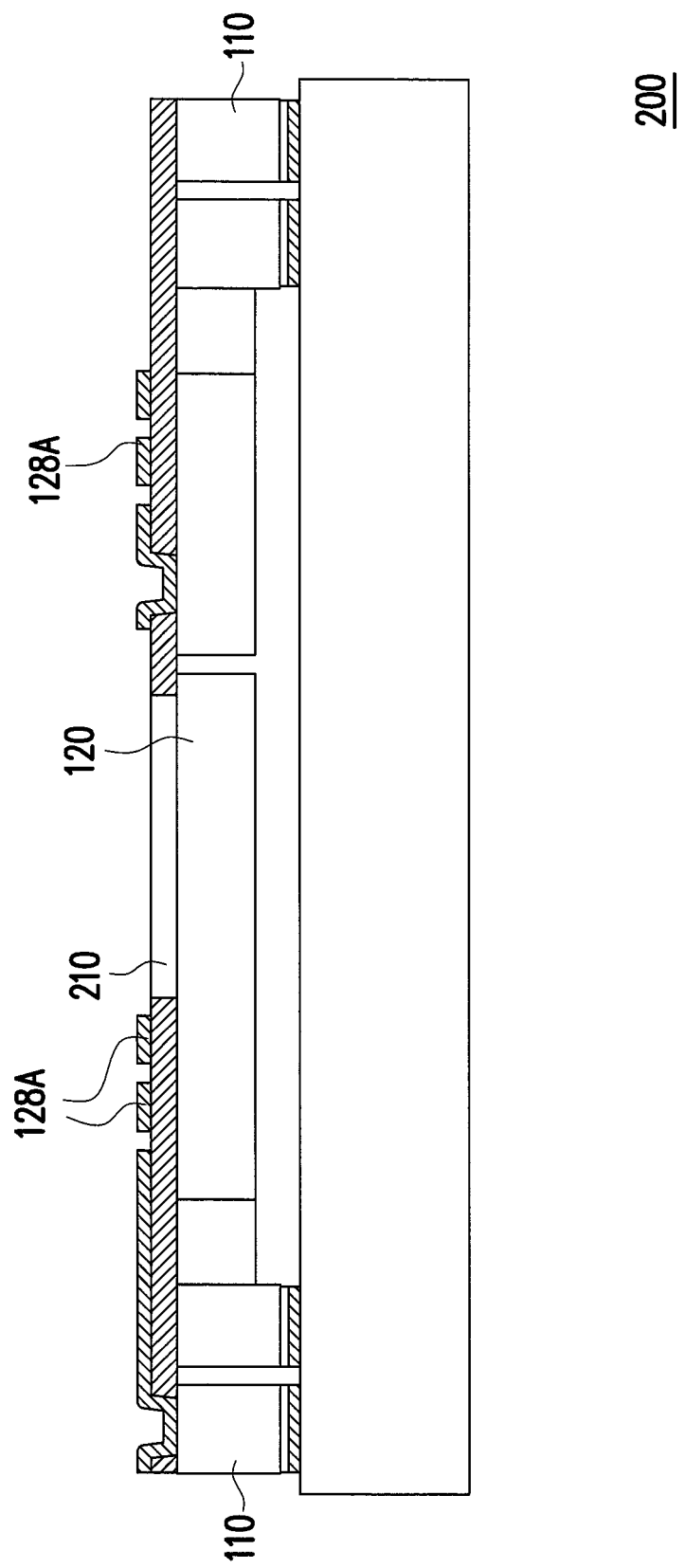
FIG. 7B is a side view of the microelectromechanical system device in FIG. 7A along a section line IV-IV.

FIG. 7A is a top view of a microelectromechanical system device with electrical interconnections according to another embodiment of the disclosure. FIG. 7B is a side view of the microelectromechanical system device in FIG. 7A along a section line IV-IV. Referring to FIG. 7A and FIG. 7B, the microelectromechanical system device with electrical interconnections 200 is a MEMS micro-mirror. The microelectromechanical system device 200 further includes a mirror layer 210, which is disposed on the upper surface of the mass 120. The shape of the mirror layer 210 may be rectangular, round, or another shape. The microelectromechanical system device 200 further includes two permanent magnets 220. As seen in FIG. 7A, the two anchors 110 are located on two opposite sides of the mass 120 and approximately arranged along the section line IV-IV, while the two permanent magnets 220 are disposed near the mass 120 and are aligned with a line that is perpendicular to the section line IV-IV. The mass 120 is located between the two permanent magnets 220, and the mass 120 is also located between the two anchors 110. The opposite magnetic poles of the two permanent magnets 220 face each other. For example, the S pole of the permanent magnet 220 on the upper side in FIG. 7A faces the N pole of the permanent magnet 220 on the lower side in FIG. 7B. The Lorentz force, induced by the electrical current and the magnetic force, may be adjusted by varying the electrical current flowing through the base conductive layer 128A. By varying the electrical current, the mass 120 can be rotated to a specific angle r. Thus, the light travelling to the mirror layer 210 will be reflected to a targeted direction. The material of the mirror layer 210 may be aluminium, silver or other proper material for reflection.

Figure 8A:
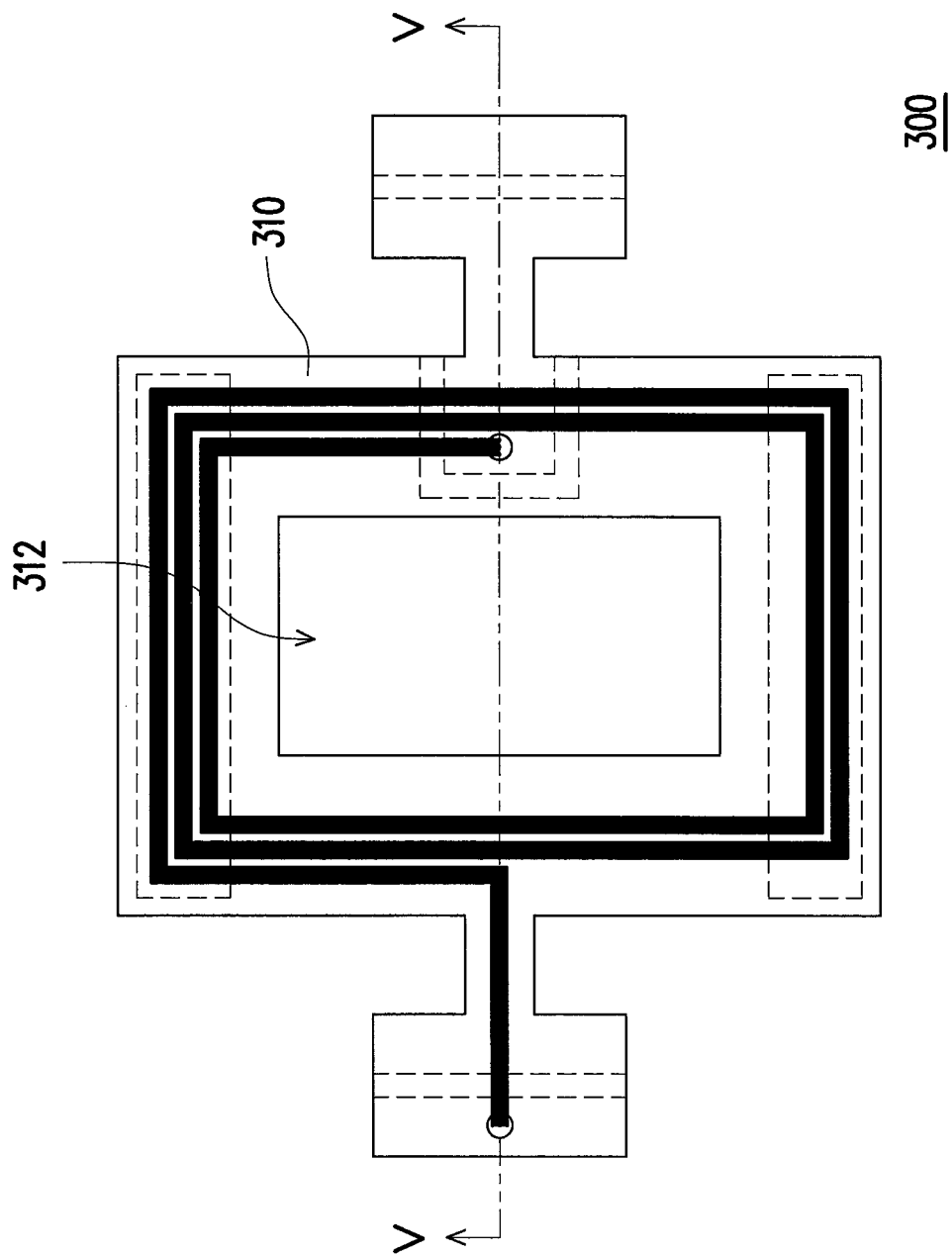
FIG. 8A is a top view of a microelectromechanical system device with electrical interconnections according to another exemplary embodiment of the disclosure.
Figure 8B:
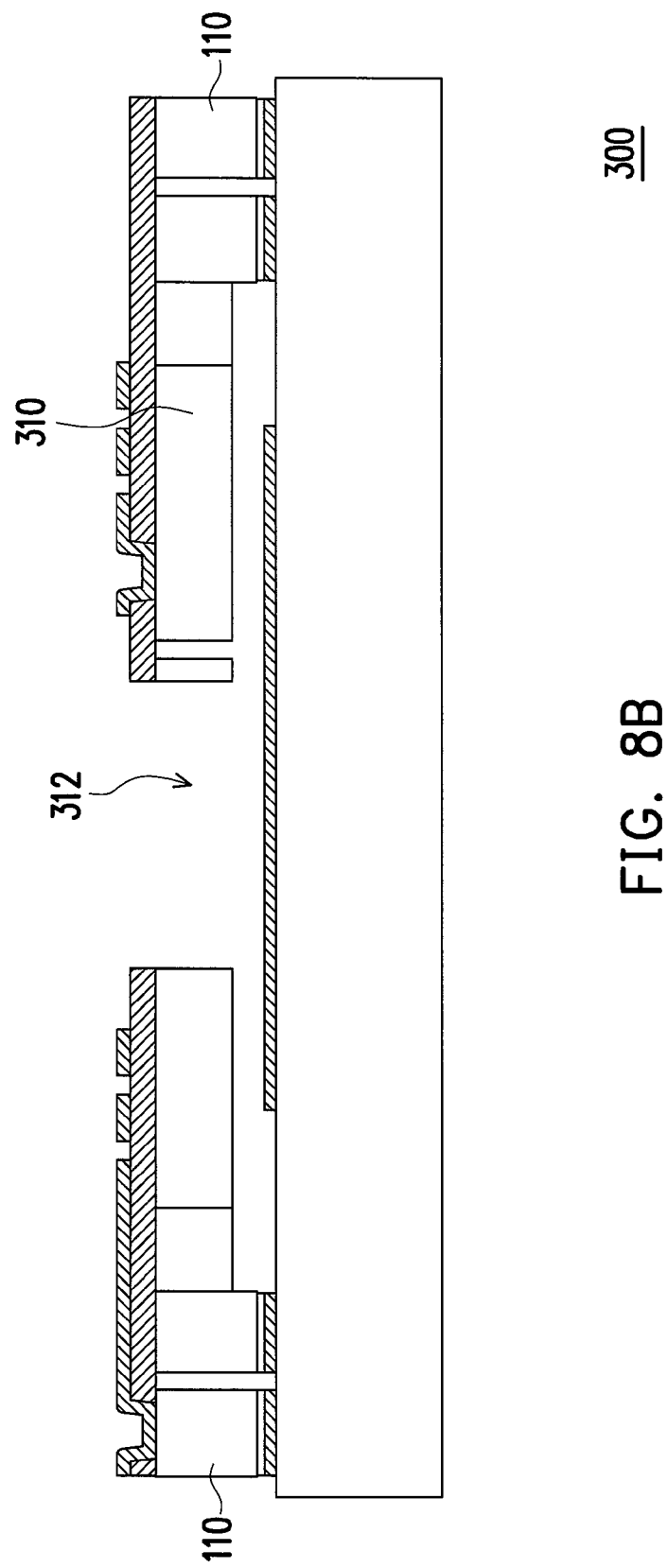
FIG. 8B is a side view of the microelectromechanical system device in FIG. 8A along a section line V-V.

FIG. 8A is a top view of a microelectromechanical system device with electrical interconnections according to another embodiment of the disclosure. FIG. 8B is a side view of the microelectromechanical system device in FIG. 8A along a section line V-V. Referring to FIG. 8A and FIG. 8B, in this embodiment, the microelectromechanical system device with electrical interconnections 300 is a MEMS magnetometer. However, the mass 310 of the embodiment is a frame, it means that the mass 310 has an opening 312. The mass 310 with the opening 312 may increase the sensitivity of the microelectromechanical system device 300.

Figure 9A:
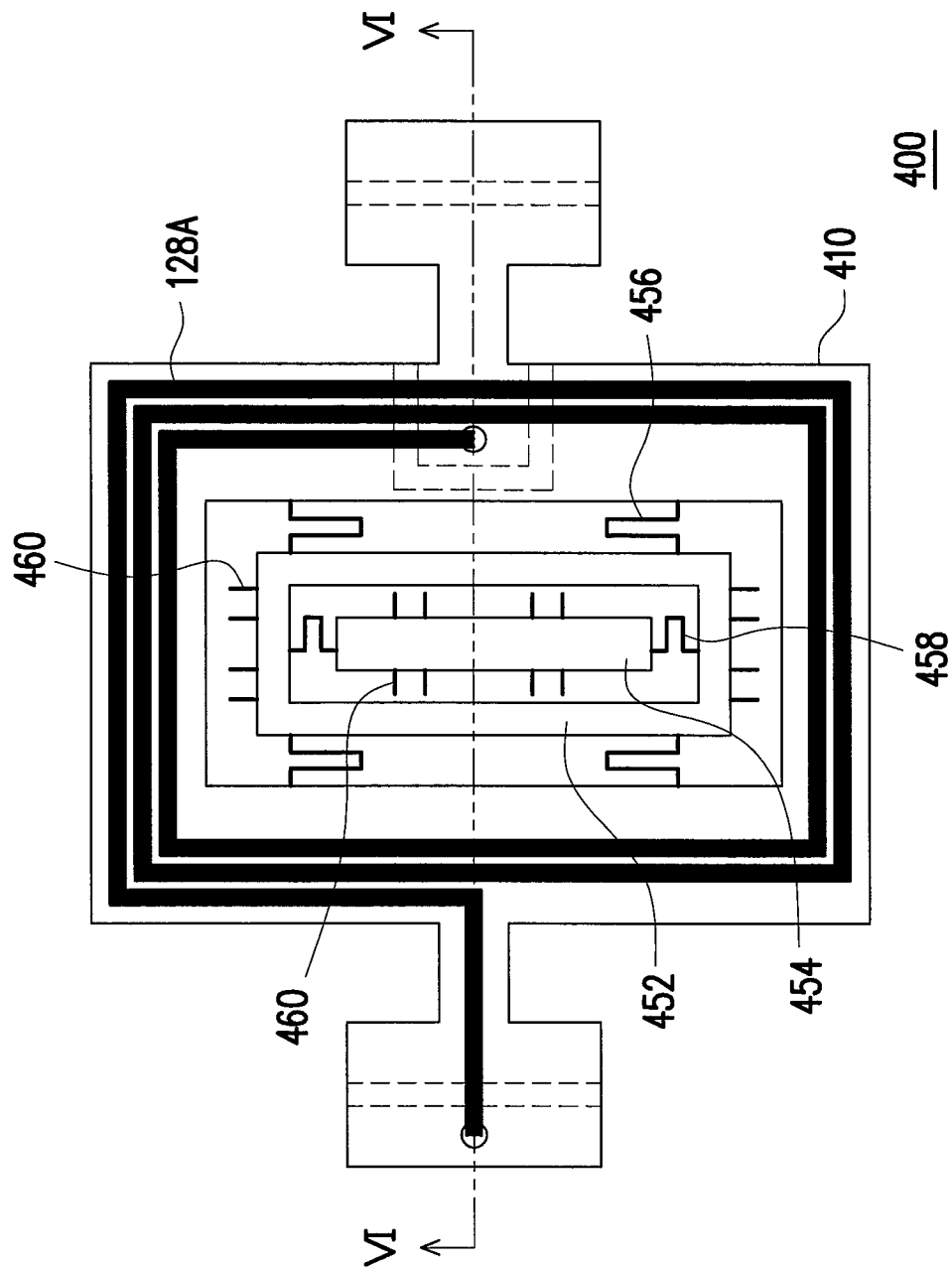
FIG. 9A is a top view of a microelectromechanical system device with electrical interconnections according to another embodiment of the disclosure.
Figure 9B:
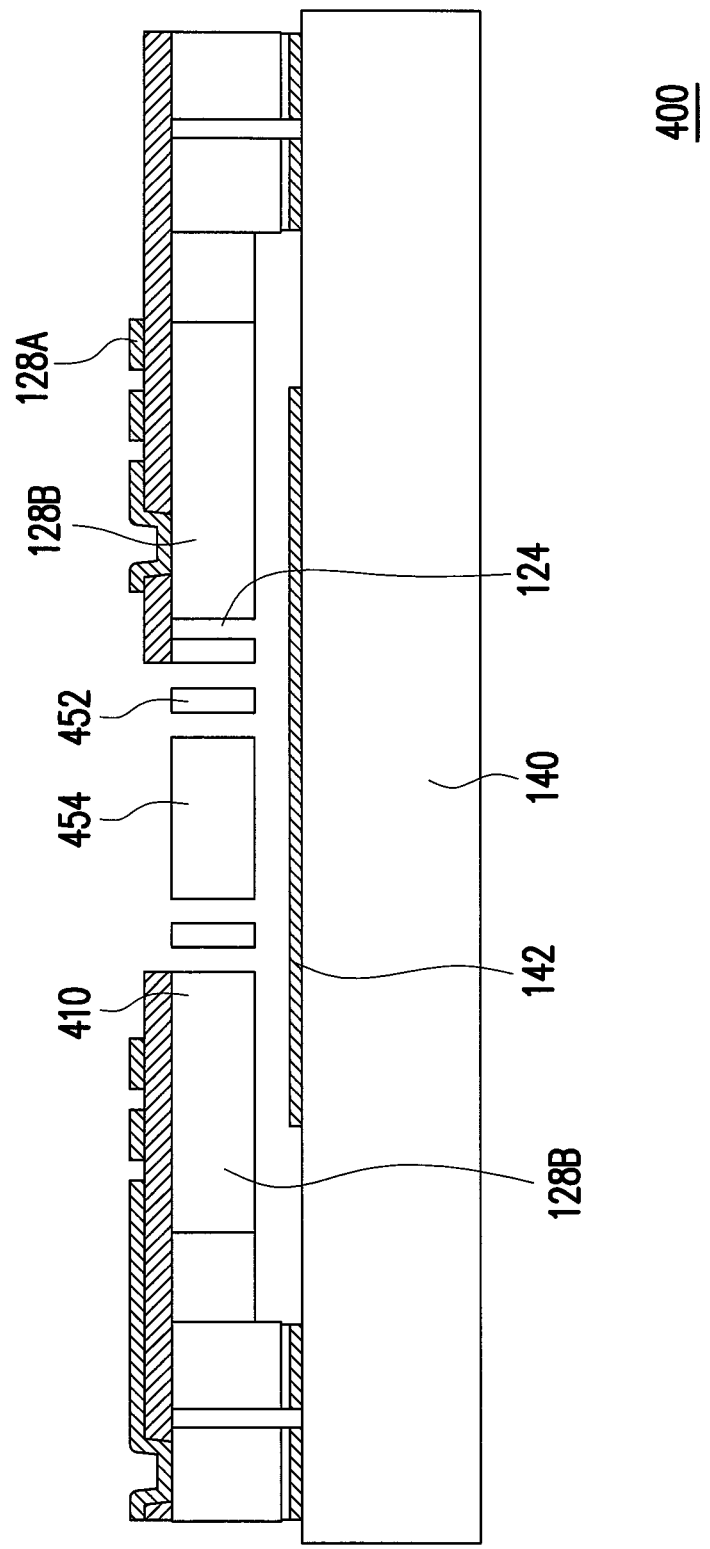
FIG. 9B is a side view of the microelectromechanical system device in FIG. 9A along a section line VI-VI.

FIG. 9A is a top view of a microelectromechanical system device with electrical interconnections according to another embodiment of the disclosure. FIG. 9B is a side view of the microelectromechanical system device in FIG. 9A along a section line VI-VI. Referring to FIG. 9A and FIG. 9B, in this embodiment, the microelectromechanical system device with electrical interconnections 400 is a combination of a magnetometer and a two-axis accelerometer. The mass 410 of the embodiment is a frame. The microelectromechanical system device 400 of the embodiment further includes an inner frame 452 and an inner mass 454. The inner frame 452 is disposed within the frame of the mass 410 and is connected to the frame of the mass 410 via a plurality of first springs 456. The inner mass 454 is disposed in the inner frame 452, and the inner mass 454 is connected to the inner frame 452 via a plurality of second springs 458. The inner mass 454 is electrically coupled to the target conductive layer 128B via the second springs 458, the inner frame 452 and the first springs 456. In addition, a plurality of moving electrodes 460 is disposed at the peripheral portion of the inner frame 452 and a plurality of moving electrodes 460 is disposed at the peripheral portion of the inner mass 454. The substrate 140 of the embodiment also includes the two electrodes 142 as shown in FIG. 9B. The two electrodes 142 are located below the frame of the mass 410. For clear identifying the key elements of the microelectromechanical system device 400 of the embodiment the electrodes 142 are omitted in FIG. 9A. The microelectromechanical system device 400 can detect the magnetic force by measuring the rotation of the frame of the mass 410 when electrical current flow through the base conductive layer 128A. The two-axis accelerations can also be detected by measuring movement of the inner frame 452 and the movement of inner mass 454 respectively.

Figure 10A:
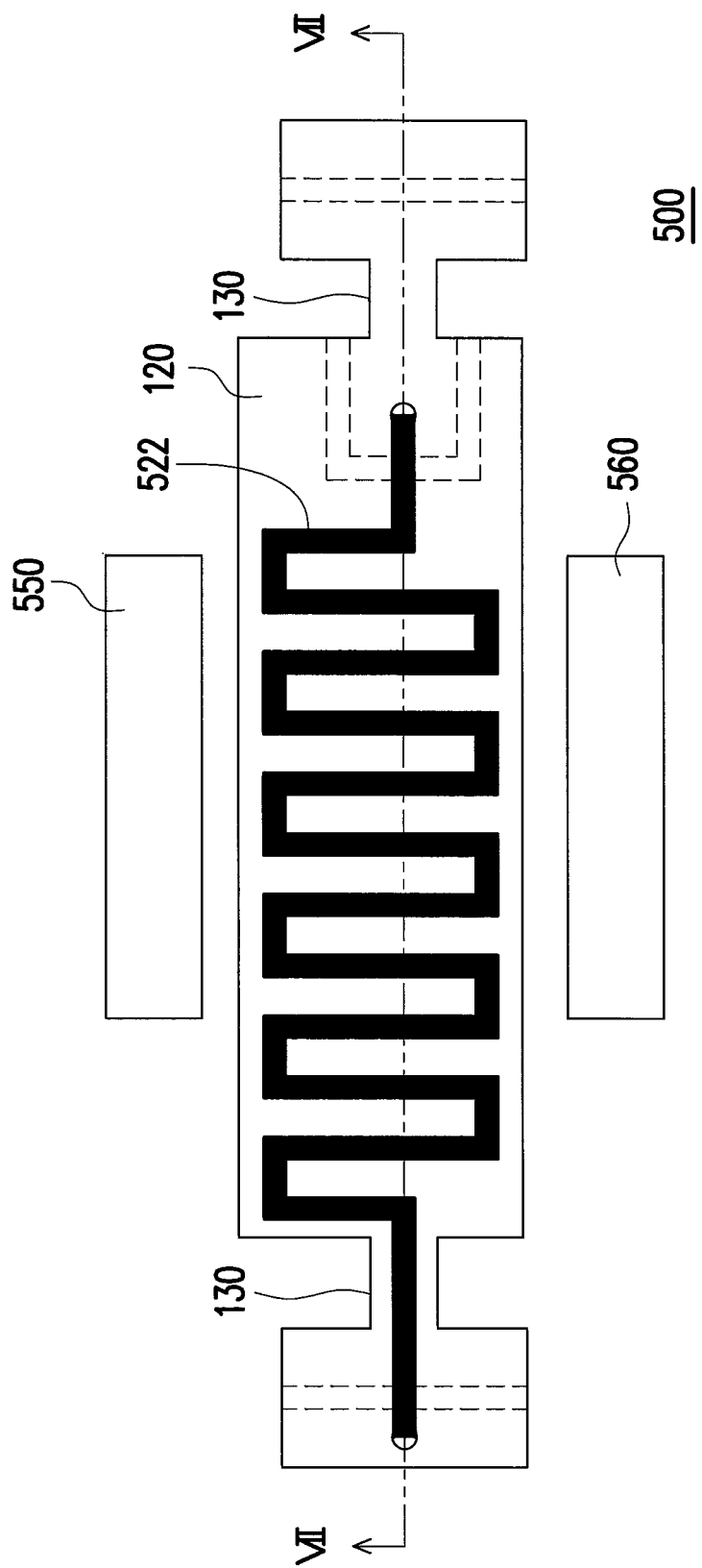
FIG. 10A is a top view of a microelectromechanical system device with electrical interconnections according to another embodiment of the disclosure.
Figure 10B:
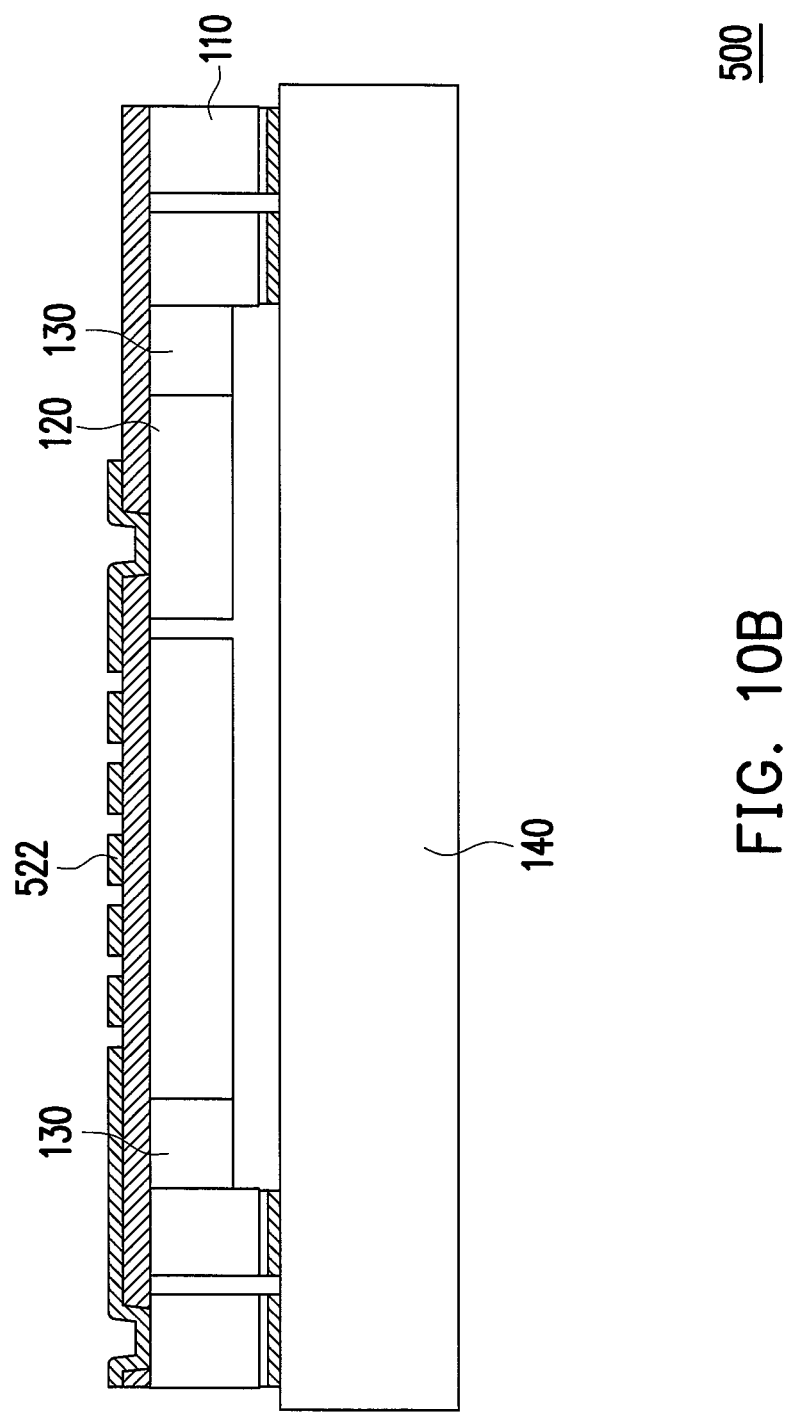
FIG. 10B is a side view of the microelectromechanical system device in FIG. 10A along a section line VII-VII.

FIG. 10A is a top view of a microelectromechanical system device with electrical interconnections according to another embodiment of the disclosure. FIG. 10B is a side view of the microelectromechanical system device in FIG. 10A along a section line VII-VII. Referring to FIG. 10A and FIG. 10B, in the embodiment, the microelectromechanical system device with electrical interconnections 500 is a MEMS oscillator. The base conductive layer 522 of the mass 120 of the microelectromechanical system device 500 in the embodiment is an electrical resistance. When the electrical current flowing through the base conductive layer 522, the base conductive layer 522 will generate heat. In one embodiment, an electrical resistance value which is proper for a heating condition can be selected for the base conductive layer 522. For example, the electrical resistance value of base conductive layer can be selected to be larger than the electrical resistance value of the target conductive layer. The microelectromechanical system device 500 of the embodiment further includes a driving electrode 550 and a sensing electrode 560, which are disposed on the substrate 140. As seen in FIG. 10A, the driving electrode 550 and the sensing electrode 560 are located on the two opposite sides of the mass 120. The driving electrode 550 and the sensing electrode 560 will drive the mass 120 to oscillate between the driving electrode 550 and the sensing electrode 560. In addition, the oscillating frequency of the oscillator will be varied with the change of the working environment temperature. In the microelectromechanical system device 500, the base conductive layer 522 may generate heat to keep the constant temperature in the working environment. Hence, the oscillating frequency of the mass 120 may not be shifted when the environment temperature is varied.

Figure 11B:
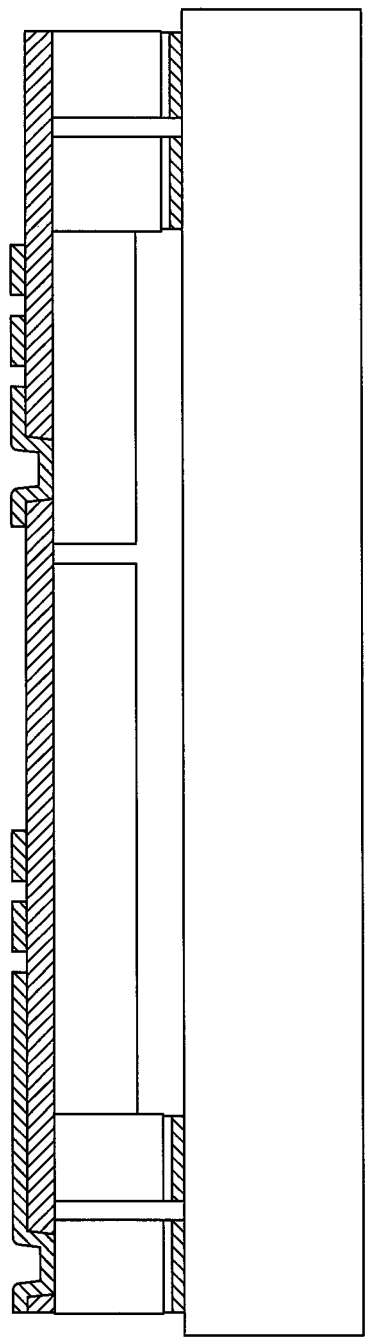
FIG. 11B is a side view of the microelectromechanical system device in FIG. 11A along a section line VIII-VIII.

FIG. 11A is a top view of a microelectromechanical system device with electrical interconnections according to another embodiment of the disclosure. FIG. 11B is a side view of the microelectromechanical system device in FIG. 11A along a section line VIII-VIII. Referring to FIG. 11A and FIG. 11B, the microelectromechanical system device with electrical interconnections 600 is a micro inductance. The two electrodes 142 and the two torsion springs 130 shown in FIG. 5A are not required in the microelectromechanical system device 600. The micro inductance of the embodiment does not need the cross-line structure for electrical interconnection and thus reduces the use of the conductive layer and the electrical insulation layer.

Figure 12A:
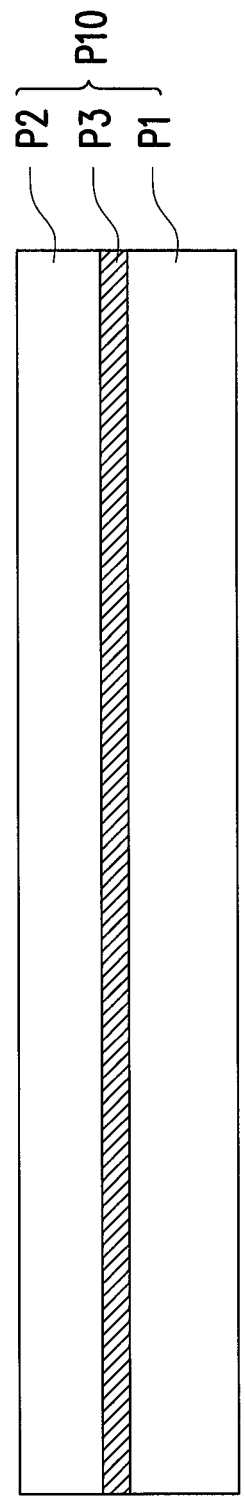
FIG. 12A to FIG. 12H are flowcharts of fabricating a microelectromechanical system device with electrical interconnections according to an embodiment of the disclosure.
Figure 12B:
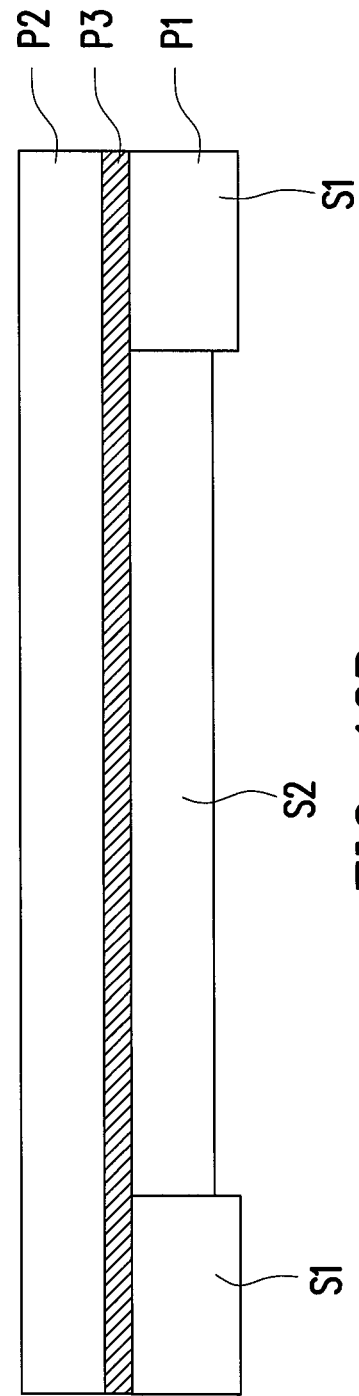
Figure 12C:
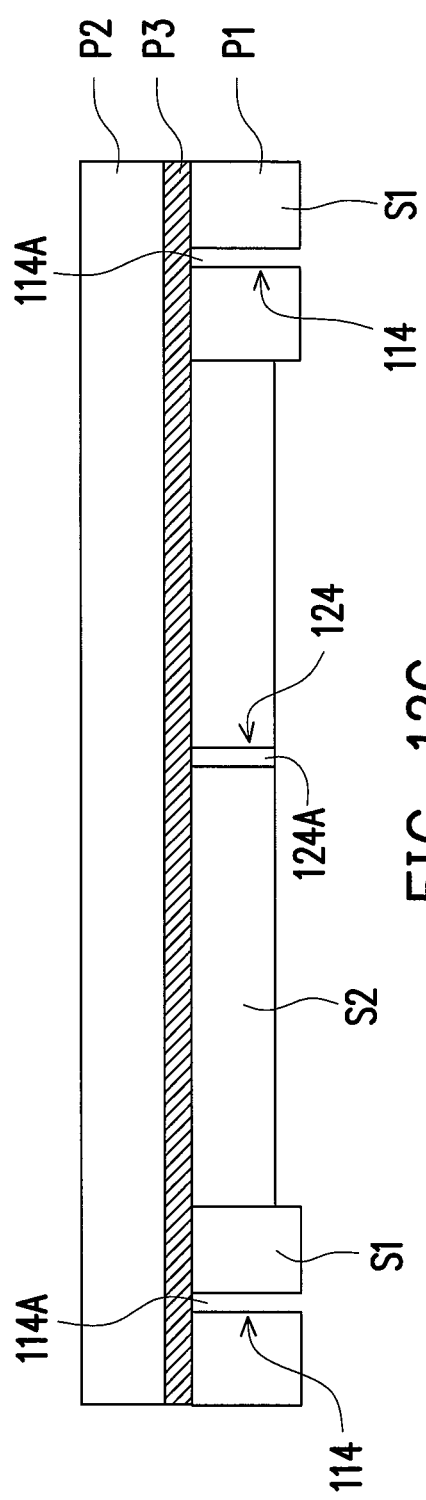

FIG. 12A to FIG. 12H are schematic fabricating flow for a microelectromechanical system device with electrical interconnections according to an embodiment of the disclosure. Referring to FIG. 12A to FIG. 12C a silicon on insulator wafer (SOI wafer) is provided. The silicon on insulator wafer P10 includes a device layer P1, a handle layer P2 and an electrical insulation layer P3 disposed between the device layer P1 and the handle layer P2. The material of the electrical insulation layer P3 may be silicon dioxide ($SiO_2$).

Etch the device layer P1 to form a plurality of protruding portions S1 and a recess portion S2 which will be used to form the anchor, the mass and the torsion spring respectively in the following fabricating steps. Then, etch a first trench 114 at each protruding portion S1, and etch a trench 124 of mass at the recess portion S2. The first trench 114 and the trench 124 of mass extend to the electrical insulation layer P3. In addition, the electrical insulation materials 114A and 124A may be filled in the first trench 114 and the trench 124 of mass to form the electrical insulation structure.

Figure 12D:
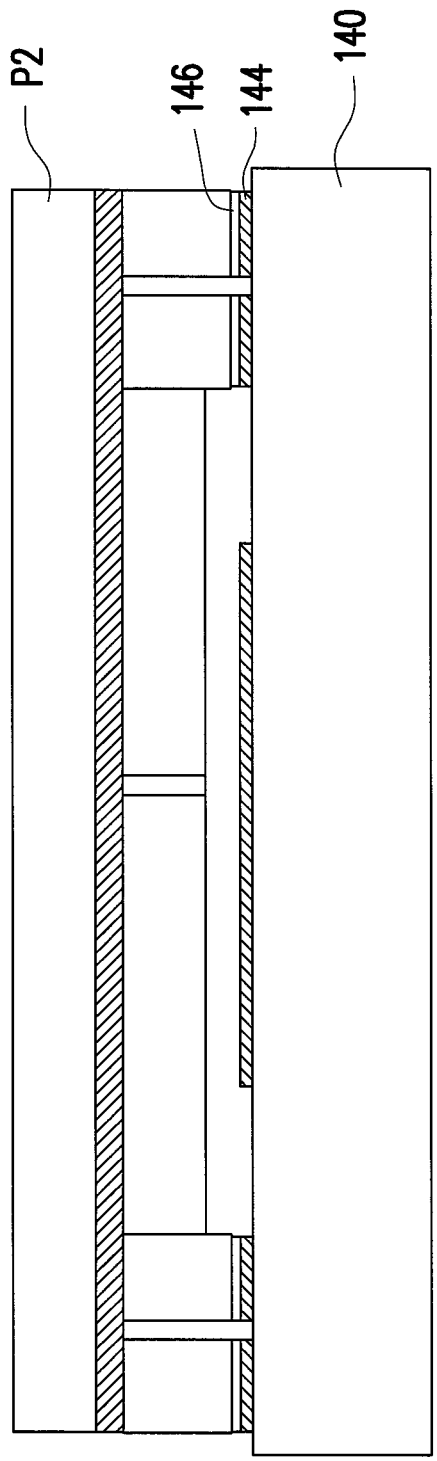
Figure 12E:
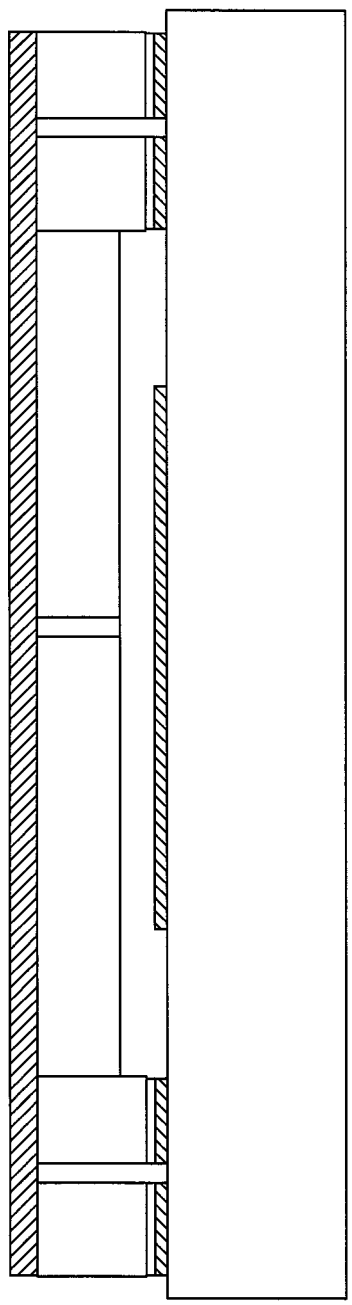

Referring to FIG. 12D and FIG. 12E, deposit the conductive bonding layer 146 on each protruding portion S1, and then bond the protruding portion S1 to the conductive layer 144 on the substrate 140 via the conductive bonding layer 146. The wafer-to-wafer metal bonding process can be employed for this bonding process. The substrate 140 may be a glass substrate or a silicon substrate with conductive traces on the surface or a circuit chip with conductive traces on the surface. When the bonding process is finished, the handle layer P2 of the SOI wafer is removed.

Figure 12F:
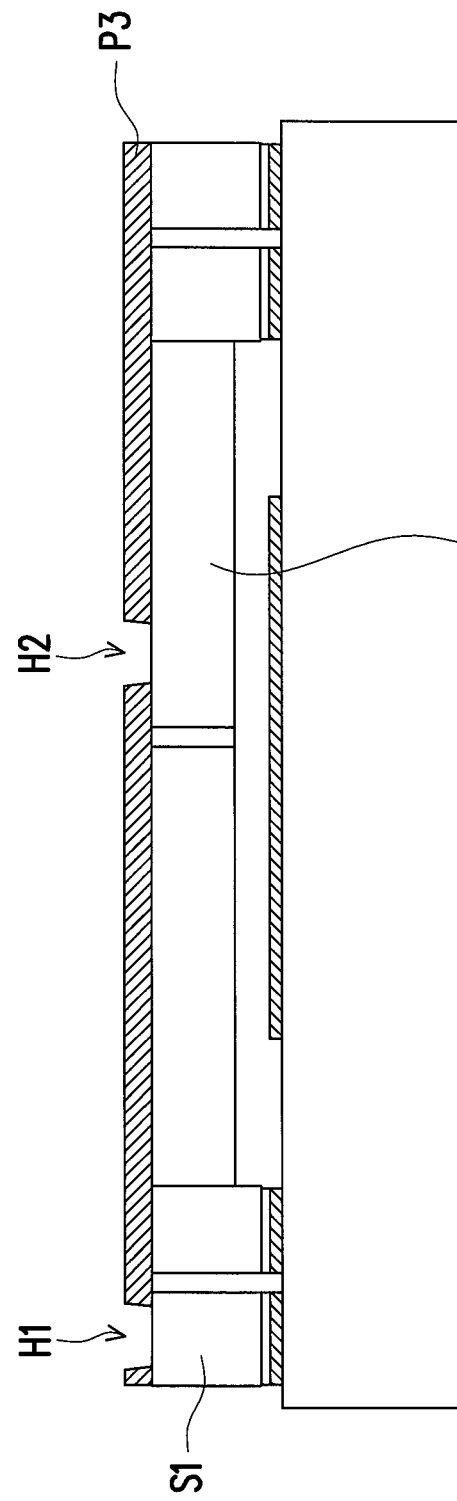
Figure 12G:
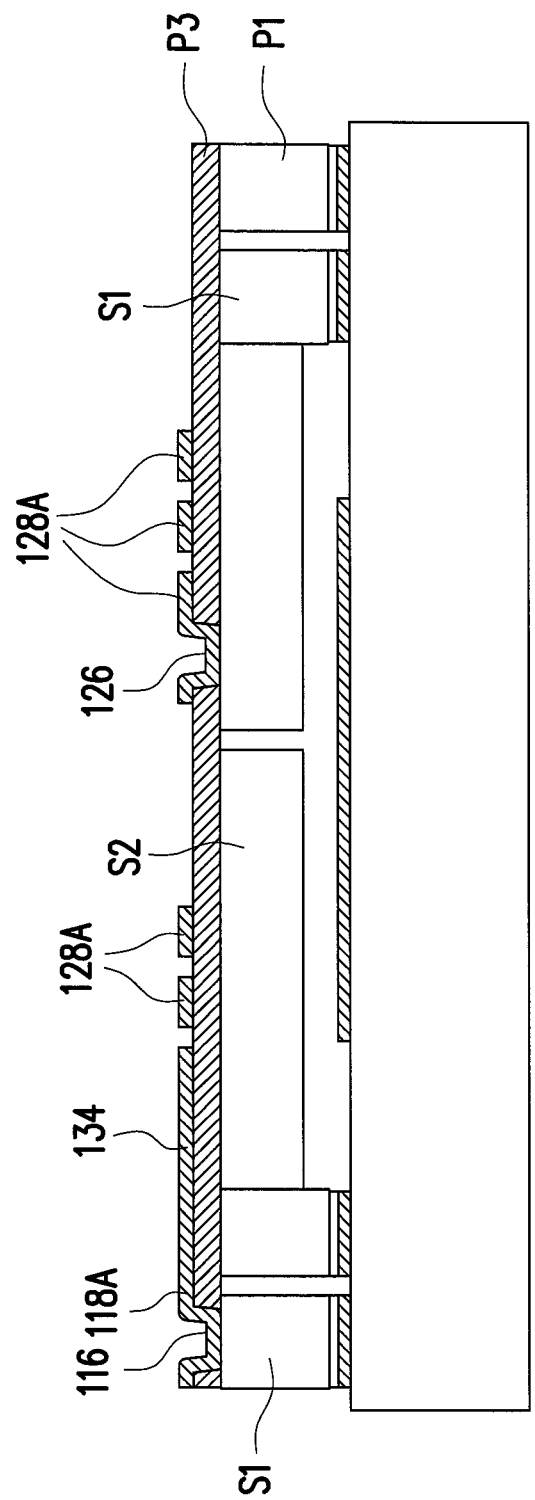

Referring to FIG. 12F and FIG. 12G, remove a portion of the electrical insulation layer P3 to form at least one first through hole H1 and at least one second through hole H2. The at least one first through hole H1 is disposed on the protruding portion S1 and portion of the protruding portions S1 is then exposed in the first through hole H1. The at least one second through hole H2 is disposed on the recess portion S2 and portion of the recess portion S2 is exposed in the second through hole H2. Then, form a plurality of upper conductive layers 118A, 128A and 134 on the electrical insulation layer P3. At the same time, a portion of the upper conductive layer 118A is filled in the first through hole H1 to form the first conductive through hole 116, and a portion of the upper conductive layer (also called the base conductive layer) 128A is filled in the second through hole H2 to form the conductive through hole 126 of mass.

Figure 12H:
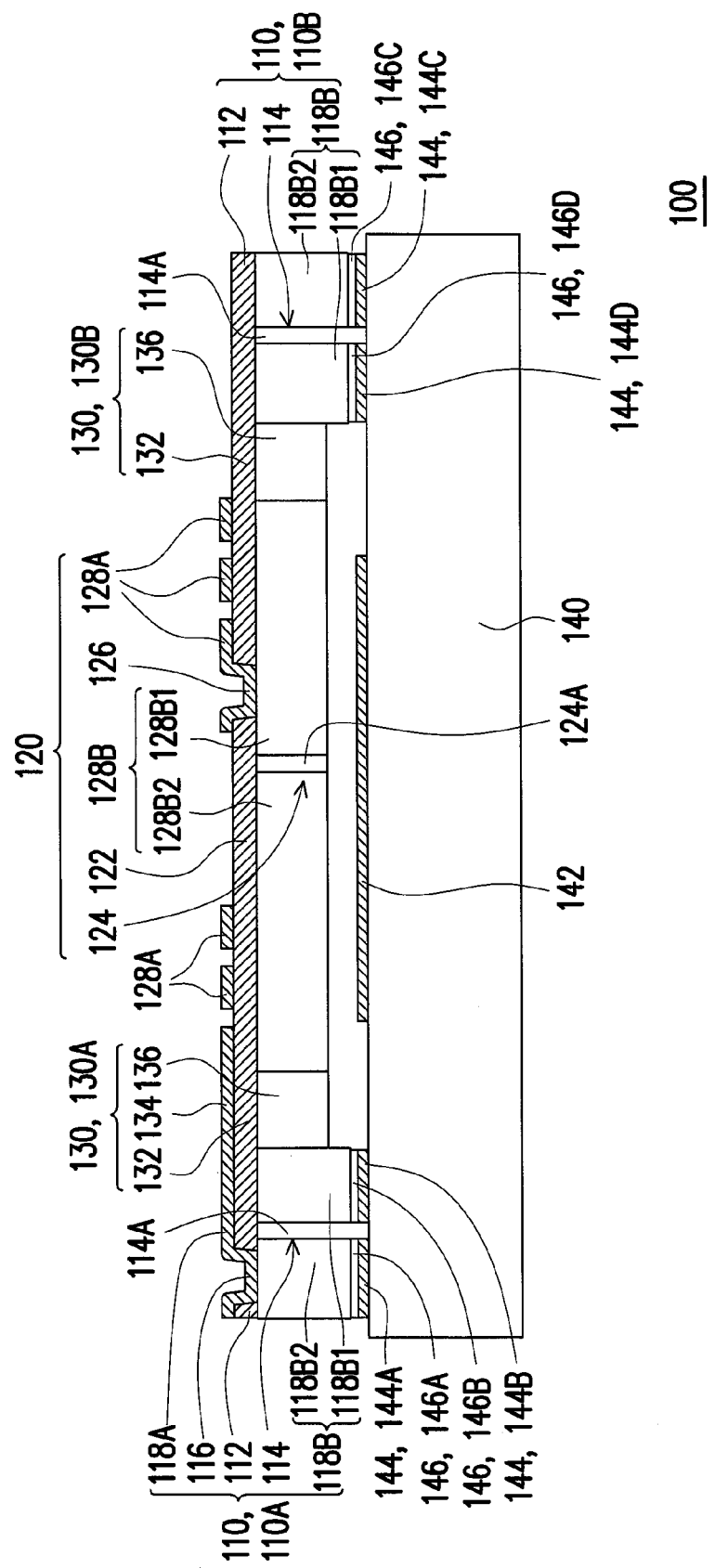

Finally, referring to FIG. 12G and FIG. 12H, pattern the device layer P1 and pattern the electrical insulation layer P3. By this process, the lower conductive layer 118B of the anchor 110 and the insulation layer of the anchor 110 are formed from the protruding portions S1. The lower conductive layer (also called the target conductive layer in this embodiment) 128B of the mass 120 and the insulation layer of the mass 120 are formed from the recess portion S2. The lower conductive layer 136 of the torsion spring 130 and the insulation layer 132 of the torsion spring is also formed from the recess portion S2. Specifically speaking, the fabricated microelectromechanical system device 100 in FIG. 12H is the same as the microelectromechanical system device 100 in FIG. 5B.

The fabricating flow as illustrated in FIG. 12A to FIG. 12H can also be applied to fabricate the microelectromechanical system device 200 as shown in FIG. 7B except for some minor modification in the step of FIG. 12F. In the modified step of FIG. 12F, a particular area as desired near a central part of the insulation layer P3 above the recess portion S2 is removed. A minor layer 210 can be formed in the hollowed portion of the particular area.

The fabricating flow as illustrated in FIG. 12A to FIG. 12H can also be applied to fabricate the microelectromechanical system device 300 as shown in FIG. 8B except for some minor modification in the step of FIG. 12C. In the modified step of FIG. 12C, the device layer P1 is etched to form the protruding portions Si and the recess portion S2, and at the same time, a particular area as desired near a central part of the device layer P1 is removed. The hollowed portion of the particular area in the device layer P1 can be the opening 312 of the mass 310 as depicted in FIG. 8B.

Figure 13A:
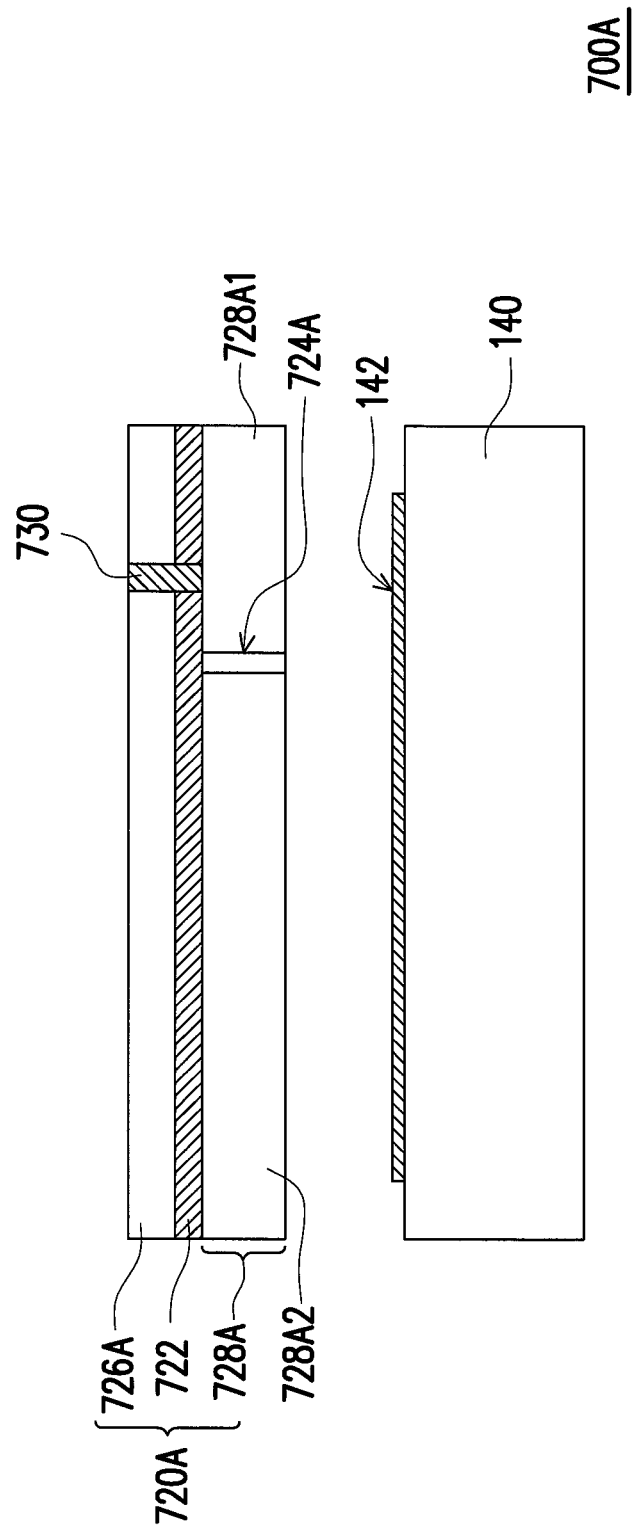
FIG. 13A and FIG. 13B are simplified cross-sectional side views of the two microelectromechanical system devices of the disclosure.

The microelectromechanical system device 700A in FIG. 13A is a simplified schematic diagram of the disclosure, where its target conductive layer 728A is located below the lower surface of the second electrical insulation layer 722. The target conductive layer 728A is the lower conductive layer located between the electrical insulation layer 722 and the electrode 142 of the substrate 140. The electrical insulation layer 722 divides the mass 720A into the base conductive layer 726A and the target conductive layer 728A. The target conductive layer 728A is divided into a first conductive portion 728A1 and a second conductive portion 728A2 which are insulated electrically from each other by the trench 724A. The conductive through hole 730 passes through the electrical insulation layer 722 and connects the base conductive layer 726A and the first conductive portion 728A1.

Figure 13B:
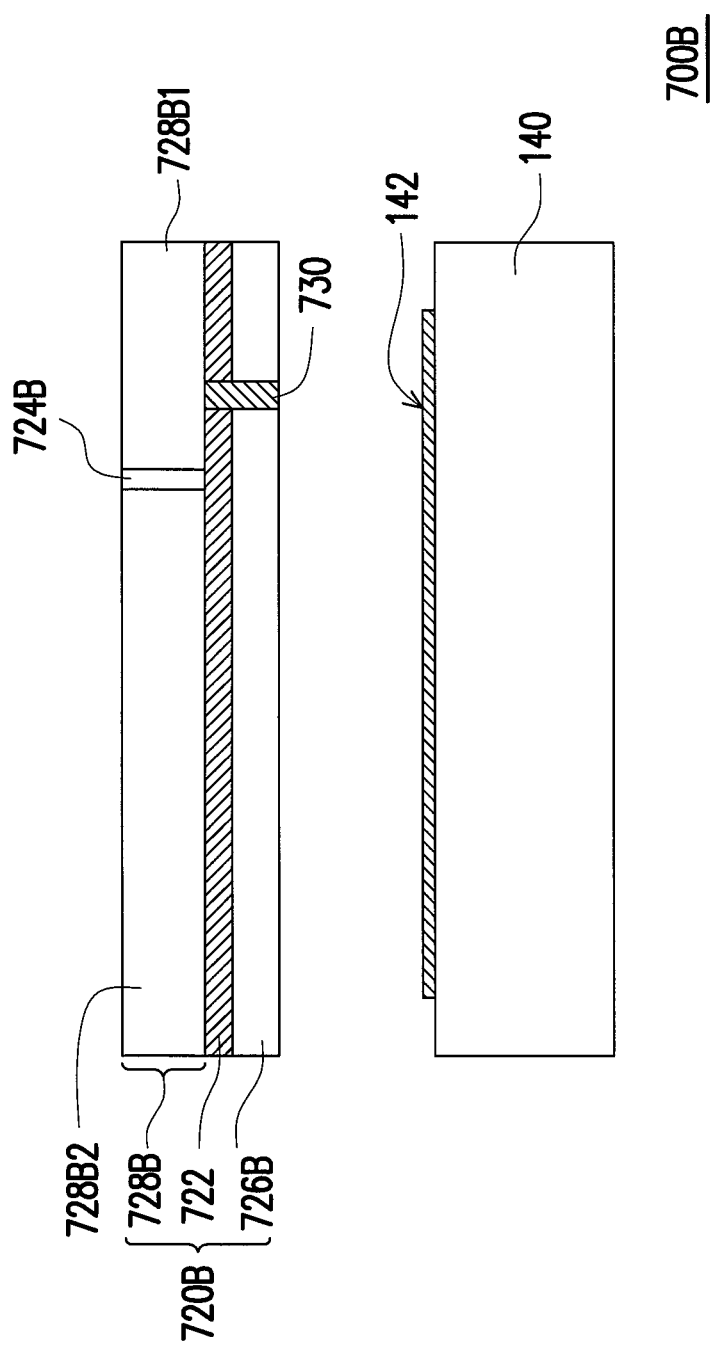

The microelectromechanical system device 700B shown in FIG. 13B is another simplified schematic diagram of the disclosure. The electrical insulation layer 722 divides the mass 720B into the base conductive layer 726B and the target conductive layer 728B. The target conductive layer 728B is disposed on the upper surface of the electrical insulation layer 722. The target conductive layer 728B is the upper conductive layer located on one side of the electrical insulation layer 722 away from the electrode 142 of the substrate 140. The target conductive layer 728B is divided into a first conductive portion 728B1 and a second conductive portion 728B2 which are insulated electrically from each other by the trench 724B. The conductive through hole 730 passes through the electrical insulation layer 722 and connects the base conductive layer 726B and the first conductive portion 728B1.

In this embodiment, electrical interconnections are formed by employing the upper conductive layer, lower conductive layer, a electrical insulation layer, trench and conductive through hole. By electrical interconnections in this embodiment, the microelectromechanical system device does not require the cross-line structure to form electrical interconnections, and thus reduces the use of the conductive layer and the electrical insulation layer. Such a microelectromechanical system device may be applied in the MEMS magnetometer, the micro-mirror, the combination of a magnetometer and a two-axis accelerometer, the MEMS oscillator and the micro inductance.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A microelectromechanical system device with electrical interconnections comprising:
    a mass including:
        an insulation layer of mass dividing the mass into a base conductive layer and a target conductive layer;
        a trench of mass disposed in the target conductive layer, the trench of mass passing through the target conductive layer to the insulation layer of mass and dividing the target conductive layer into a first conductive portion and a second conductive portion which are insulated electrically from each other;
        a conductive through hole of mass passing through the insulation layer of mass and connecting the base conductive layer and the first conductive portion; and
    a substrate including:
        at least one electrode disposed on an upper surface of the substrate;
        wherein, in a working status, an electrical current flows through the base conductive layer, the conductive through hole of mass and the first conductive portion and an electrical potential difference exists between the second conductive portion and the electrode.

2. The microelectromechanical system device with electrical interconnections according to claim 1, further comprising:
    a first anchor including:
        a first insulation layer dividing the first anchor into an upper conductive layer of the first anchor and a lower conductive layer of the first anchor; and
        a first trench disposed in the lower conductive layer of the first anchor, the first trench passing through the lower conductive layer of the first anchor to the first insulation layer and dividing the lower conductive layer of the first anchor into an inner conductive portion of the first anchor and an outer conductive portion of the first anchor which are insulated electrically from each other;
        wherein, the inner conductive portion of the first anchor is electrically coupled to the second conductive portion; and
    a second anchor including:
        a second insulation layer dividing the second anchor into an upper conductive layer of the second anchor and a lower conductive layer of the second anchor.

3. The microelectromechanical system device with electrical interconnections according to claim 1, wherein the microelectromechanical system device with electrical interconnections is adapted to sense magnetic force.

4. The microelectromechanical system device with electrical interconnections according to claim 2, further comprising at least one first conductive through hole disposed in the first anchor, the at least one first conductive through hole passing through the first insulation layer and connecting the upper conductive layer of the first anchor and the outer conductive portion of the first anchor.

5. The microelectromechanical system device with electrical interconnections according to claim 2, further comprising at least one spring including:
a third insulation layer dividing the at least one spring into an upper conductive layer of the spring and a lower conductive layer of the spring, wherein the lower conductive layer of the spring connects the inner conductive portion of the first anchor and the second conductive portion of the mass, and the upper conductive layer of the spring connects the upper conductive layer of the first anchor and the base conductive layer.

6. The microelectromechanical system device with electrical interconnections according to claim 1, wherein a portion of the insulation layer of mass is covered by the base conductive layer, and the base conductive layer is a spiral-shaped conductor with at least one turn.

7. The microelectromechanical system device with electrical interconnections according to claim 1, wherein the trench of mass is an open-loop-shaped electrical insulation trench.

8. The microelectromechanical system device with electrical interconnections according to claim 2, further comprising an electrical insulation material filled in the first trench and the trench of mass.

9. The microelectromechanical system device with electrical interconnections according to claim 2, further comprising two pennanent magnets and a second anchor, wherein the first anchor and the second anchor are located on two opposite sides of the mass, and the two permanent magnets are located near the mass and are aligned with a line that is perpendicular to the line connecting the first anchor and the second anchor.

10. The microelectromechanical system device with electrical interconnections according to claim 1, wherein the mass is a frame.

11. The microelectromechanical system device with electrical interconnections according to claim 10, further comprising:
an inner frame disposed in the frame and connected to the frame via a plurality of first springs; and
an inner mass disposed in the inner frame and connected to the inner frame via a plurality of second springs;
wherein, the inner mass is electrically coupled to the target conductive layer of the frame through the second springs, the inner frame and the first springs.

12. The microelectromechanical system device with electrical interconnections according to claim 1, wherein an electrical resistance of the base conductive layer is greater than an electrical resistance of the target conductive layer.

13. A microelectromechanical system device with electrical interconnections, being adapted to sense magnetic force, comprising:
a first anchor including:
a first insulation layer dividing the first anchor into an upper conductive layer of the first anchor and a lower conductive layer of the first anchor;
a first trench disposed in the lower conductive layer of the first anchor, the first trench passing through the lower conductive layer of the first anchor to the first insulation layer and dividing the lower conductive layer of the first anchor into an inner conductive portion of the first anchor and an outer conductive portion of the first anchor which are insulated electrically from each other;
a first conductive through hole disposed in the first anchor, the first conductive through hole passing through the first insulation layer and connecting the upper conductive layer of the first anchor and the outer conductive portion of the first anchor;
a second anchor including:
a second insulation layer dividing the second anchor into an upper conductive layer of the second anchor and a lower conductive layer of the second anchor;
a second trench disposed in the lower conductive layer of the second anchor, the second trench passing through the lower conductive layer of the second anchor to the second insulation layer and dividing the lower conductive layer of the second anchor into an inner conductive portion of the second anchor and an outer conductive portion of the second anchor which are insulated electrically from each other;
a mass including:
an insulation layer of mass dividing the mass into a base conductive layer and a target conductive layer;
a trench of mass, being an open-loop-shaped electrical insulation trench, disposed in the target conductive layer, the trench of mass passing through the target conductive layer to the insulation layer of mass and dividing the target conductive layer into a first conductive portion and a second conductive portion which are insulated electrically from each other; and
a conductive through hole of mass passing through the insulation layer of mass and connecting the base conductive layer and the first conductive portion;
two torsion springs, each of the torsion springs including:
a third insulation layer dividing each of the torsion springs into an upper conductive layer of the torsion spring and a lower conductive layer of the torsion spring;
wherein,
the base conductive layer is a spiral-shaped conductor with at least one turn;
the upper conductive layer of one of the torsion springs connects the upper conductive layer of the first anchor and the base conductive layer, and the lower conductive layer of the one of the torsion springs connects the inner conductive portion of the first anchor and the second conductive portion of the mass;
the lower conductive layer of the other torsion spring connects the inner conductive portion of the second anchor and the first conductive portion of the mass.

14. The microelectromechanical system device with electrical interconnections according to claim 13, further comprising a substrate with at least one electrode thereon, wherein in a working status, an electrical potential difference exists between the at least one electrode and the second conductive portion of the mass.

15. The microelectromechanical system device with electrical interconnections according to claim 13, wherein an electrical current, in a working status, flows through the outer conductive portion of the first anchor, the first conductive through hole, the upper conductive layer of the first anchor, the upper conductive layer of the one of the torsion springs, the base conductive layer, the conductive through hole of mass, the first conductive portion, the lower conductive layer of the other one of the torsion springs and the inner conductive portion of the second anchor sequentially.

16. The microelectromechanical system device with electrical interconnections according to claim 13, wherein the mass is a frame.

17. A method for fabricating a microelectromechanical system device with electrical interconnections, the method comprising:

providing a substrate including at least one electrode disposed on an upper surface of the substrate;
forming a mass, wherein the mass comprises
an insulation layer of mass dividing the mass into a base conductive layer and a target conductive layer;
a trench of mass disposed in the target conductive layer, the trench of mass passing through the target conductive layer to the insulation layer of mass and dividing the target conductive layer into a first conductive portion and a second conductive portion which are insulated electrically from each other;
forming a conductive through hole of mass passing through the insulation layer of mass and connecting the base conductive layer and the first conductive portion,
wherein, in a working status, an electrical current can flow through the base conductive layer, the conductive through hole of mass and the first conductive portion and an electrical potential difference exists between the second conductive portion and the electrode of the substrate.

18. The method for fabricating a microelectromechanical system device with electrical interconnections according to claim 17, the method further comprising:
forming a first anchor on the substrate, wherein the first anchor including:
a first insulation layer dividing the first anchor into an upper conductive layer of the first anchor and a lower conductive layer of the first anchor; and
a first trench disposed in the lower conductive layer of the first anchor, the first trench passing through the lower conductive layer of the first anchor to the first insulation layer and dividing the lower conductive layer of the first anchor into an inner conductive portion of the first anchor and an outer conductive portion of the first anchor which are insulated electrically from each other,
wherein the inner conductive portion of the first anchor is electrically coupled to the second conductive portion; and
forming a second anchor on the substrate, wherein the second anchor including:
a second insulation layer dividing the second anchor into an upper conductive layer of the second anchor and a lower conductive layer of the second anchor.

19. The method for fabricating a microelectromechanical system device with electrical interconnections according to claim 18, the method further comprising:
forming at least one spring, wherein the at least one spring including:
a third insulation layer dividing the at least one spring into an upper conductive layer of the spring and a lower conductive layer of the spring, wherein the lower conductive layer of the spring connects the inner conductive portion of the first anchor and the second conductive portion of the mass, and the upper conductive layer of the spring connects the upper conductive layer of the first anchor and the base conductive layer.

20. The method for fabricating a microelectromechanical system device with electrical interconnections according to claim 17, wherein a portion of the insulation layer of mass is covered by the base conductive layer, and the base conductive layer is a spiral-shaped conductor with at least one turn.

21. The method for fabricating a microelectromechanical system device with electrical interconnections according to claim 17, wherein the trench of mass is an open-loop-shaped electrical insulation trench.

22. The method for fabricating a microelectromechanical system device with electrical interconnections according to claim 18, wherein the method further comprising forming an electrical insulation material filled in the first trench and the trench of mass.

23. The method for fabricating a microelectromechanical system device with electrical interconnections according to claim 18, wherein the first anchor and the second anchor are located on two opposite sides of the mass, and two permanent magnets are located near the mass and are aligned with a line that is perpendicular to the line connecting the first anchor and the second anchor.

24. The method for fabricating a microelectromechanical system device with electrical interconnections according to claim 17, wherein the mass formed is a frame, and the method further comprising:
forming an inner frame disposed in the frame and connected to the frame via a plurality of first springs; and
forming an inner mass disposed in the inner frame and connected to the inner frame via a plurality of second springs,
wherein, the inner mass is electrically coupled to the target conductive layer of the frame through the second springs, the inner frame and the first springs.

25. The method for fabricating a microelectromechanical system device with electrical interconnections according to claim 17, wherein an electrical resistance of the base conductive layer is greater than an electrical resistance of the target conductive layer.

26. A method for fabricating a microelectromechanical system device with electrical interconnections, the method comprising:
forming a first anchor, wherein the first anchor including:
an first insulation layer dividing the first anchor into an upper conductive layer of the first anchor and a lower conductive layer of the first anchor;
an first trench disposed in the lower conductive layer of the first anchor, the first trench passing through the lower conductive layer of the first anchor to the first insulation layer and dividing the lower conductive layer of the first anchor into an inner conductive portion of the first anchor and an outer conductive portion of the first anchor which are insulated electrically from each other;
a first conductive through hole disposed in the first anchor, the first conductive through hole passing through the first insulation layer and connecting the upper conductive layer of the first anchor and the outer conductive portion of the first anchor;
forming a second anchor, wherein the second anchor including:
a second insulation layer dividing the second anchor into an upper conductive layer of the second anchor and a lower conductive layer of the second anchor;
an second trench disposed in the lower conductive layer of the second anchor, the second trench passing through the lower conductive layer of the second anchor to the second insulation layer and dividing the lower conductive layer of the second anchor into an inner conductive portion of the second anchor and an outer conductive portion of the second anchor which are insulated electrically from each other;
forming a mass, wherein the mass including:
an insulation layer of mass dividing the mass into a base conductive layer and a target conductive layer;
a trench of mass, being an open-loop-shaped electrical insulation trench, disposed in the target conductive layer, the trench of mass passing through the target conductive layer to the insulation layer of mass and dividing the target conductive layer into a first conductive portion and a second conductive portion which are insulated electrically from each other; and forming a conductive through hole of mass passing through the insulation layer of mass and connecting the base conductive layer and the first conductive portion;

forming two torsion springs, wherein each of the torsion springs including:

a third insulation layer dividing each of the torsion springs into an upper conductive layer of the torsion spring and a lower conductive layer of the torsion spring;

wherein, the base conductive layer is a spiral-shaped conductor with at least one turn;

the upper conductive layer of one of the torsion springs connects the upper conductive layer of the first anchor and the base conductive layer, and the lower conductive layer of the one of the torsion springs connects the inner conductive portion of the first anchor and the second conductive portion of the mass;

the lower conductive layer of the other torsion spring connects the inner conductive portion of the second anchor and the first conductive portion of the mass.

27. The method for fabricating a microelectromechanical system device with electrical interconnections according to claim 26, the method further comprising forming a substrate with at least one electrode thereon, wherein in a working status, an electrical potential difference can exist between the at least one electrode and the second conductive portion of the mass.

28. The method for fabricating a microelectromechanical system device with electrical interconnections according to claim 26, wherein an electrical current, in a working status, can flow through the outer conductive portion of the first anchor, the first conductive through hole, the upper conductive layer of the first anchor, the upper conductive layer of the one of the torsion springs, the base conductive layer, the conductive through hole of mass, the first conductive portion, the lower conductive layer of the other one of the torsion springs and the inner conductive portion of the second anchor sequentially.

* * * * *